# (12) United States Patent
Takahashi

(10) Patent No.: US 6,448,132 B2
(45) Date of Patent: *Sep. 10, 2002

(54) SEMICONDUCTOR DEVICE HAVING A LOWER ELECTRODE APERTURE THAT IS LARGER THAN THE PHOTOLITHOGRAPHY RESOLUTION OF THE CAPACITOR PATTERN

(75) Inventor: Masashi Takahashi, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,883

(22) Filed: Dec. 21, 1998

(30) Foreign Application Priority Data

Feb. 26, 1998 (JP) .......................................... 10-045719

(51) Int. Cl.$^7$ .......................................... H01L 21/8242
(52) U.S. Cl. ...................... 438/244; 438/254; 438/387; 438/397; 257/303; 257/308; 257/309
(58) Field of Search ................................ 257/296, 295, 257/301, 306, 309, 303, 308; 438/254, 255, 396, 397, 244, 387, 253

(56) References Cited

U.S. PATENT DOCUMENTS

| | | | | |
|---|---|---|---|---|
| 5,208,180 A | * | 5/1993 | Gonzalez | 437/48 |
| 5,300,801 A | * | 4/1994 | Blalock et al. | 257/309 |
| 5,381,365 A | * | 1/1995 | Ajika et al. | 257/296 |
| 5,391,511 A | * | 2/1995 | Doan et al. | 437/49 |
| 5,436,188 A | * | 7/1995 | Chen | 437/52 |
| 5,444,653 A | * | 8/1995 | Nagaswaw et al. | 257/309 |
| 5,521,408 A | * | 5/1996 | Rha et al. | 257/309 |
| 5,683,922 A | * | 11/1997 | Jeng et al. | 437/195 |
| 5,837,594 A | * | 11/1998 | Honma et al. | 438/396 |
| 6,011,286 A | * | 1/2000 | Wu | 257/309 |
| 6,025,277 A | * | 2/2000 | Chen et al. | 438/738 |
| 6,043,119 A | * | 3/2000 | Wu et al. | 438/254 |
| 6,051,859 A | * | 4/2000 | Hosotani et al. | 257/306 |
| 6,104,055 A | * | 8/2000 | Watanabe | 257/309 |
| 6,251,742 B1 | * | 6/2001 | Lin | 438/396 |
| 6,261,900 B1 | * | 7/2001 | Liao et al. | 438/253 |
| 6,294,436 B1 | * | 9/2001 | Park et al. | 438/396 |

* cited by examiner

*Primary Examiner*—Wael Fahmy
(74) *Attorney, Agent, or Firm*—Volentine Francos, PLLC

(57) ABSTRACT

A capacitor having sufficient capacity without increased step difference between a memory cell portion and surrounding area. Silicon dioxide, silicon nitride, and a resist are layered on an underlying layer. Capacitor opening patterns limited in size by photolithography resolution, are formed in the resist and silicon nitride by photolithography. The patterned silicon nitride acts as a mask and a pocket with an aperture greater than the capacitor pattern is formed in the silicon dioxide by isotropic etching. Conductive polysilicon is formed on the wall of the pocket and is patterned to form a storage electrode. After a capacitor insulator is formed on the storage electrode, a cell plate electrode is formed to provide a capacitor structure. The aperture area of the storage electrode is made larger than the area of the capacitor pattern based on the thickness of the conductive polysilicon.

4 Claims, 22 Drawing Sheets

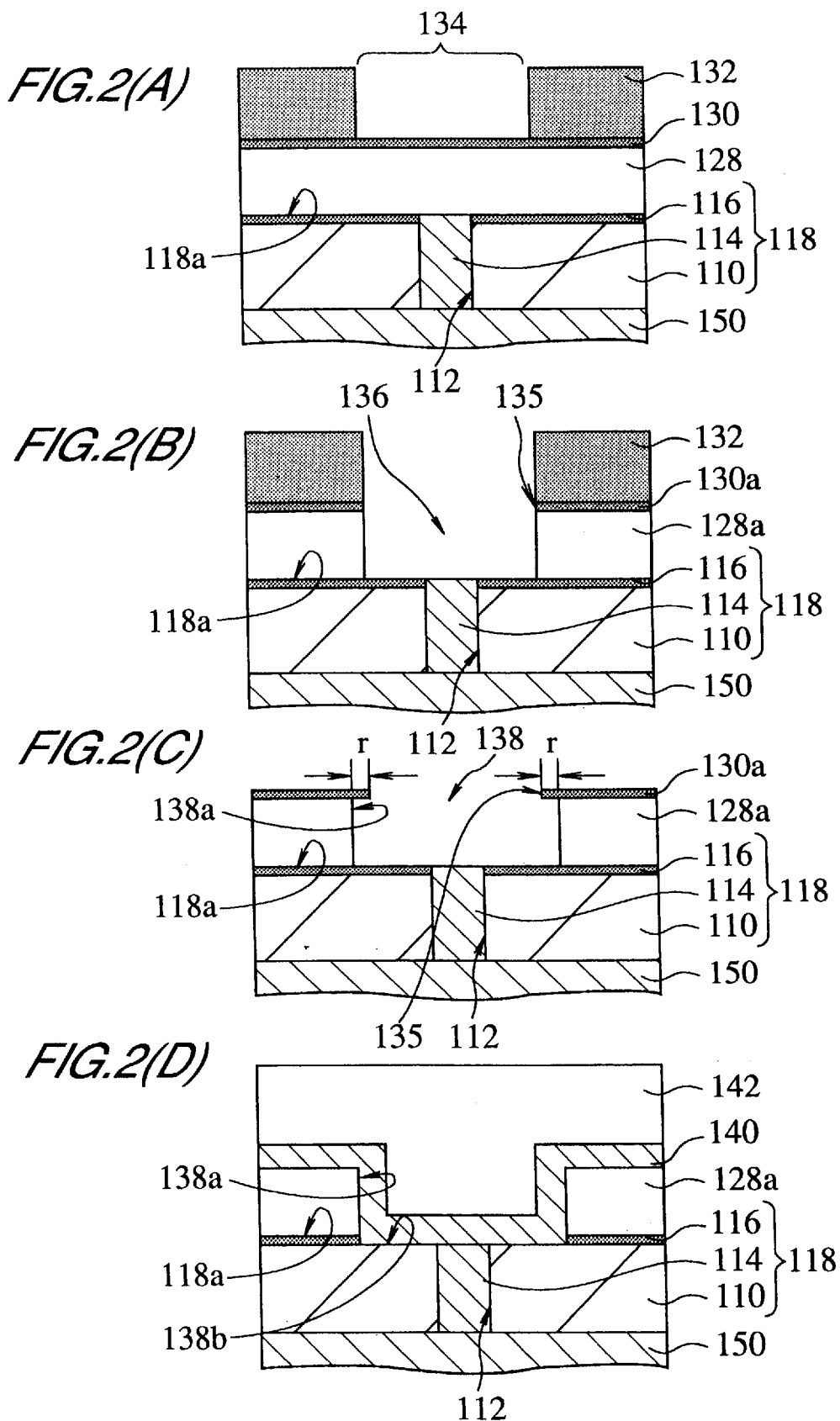

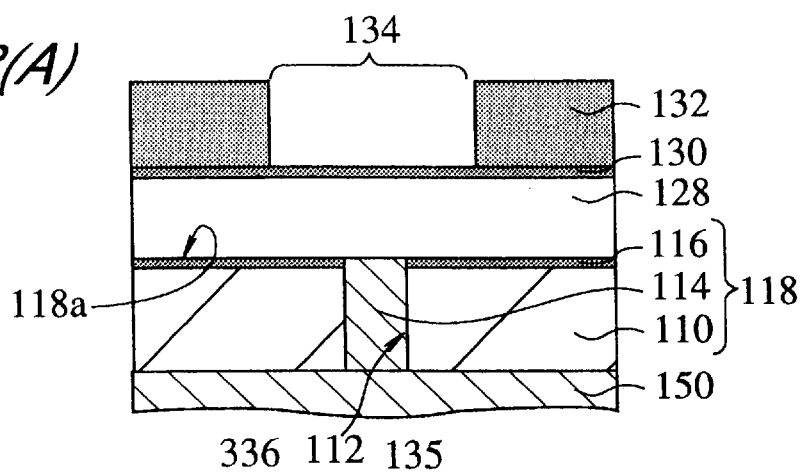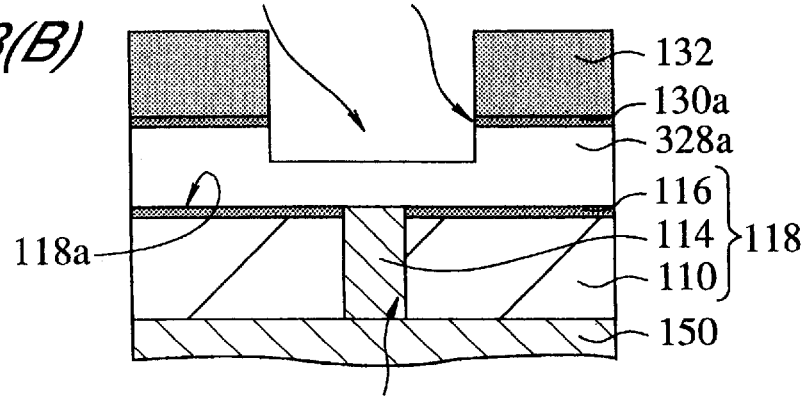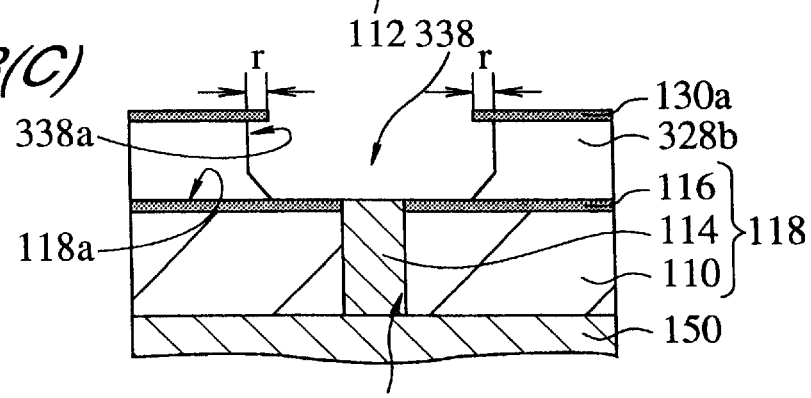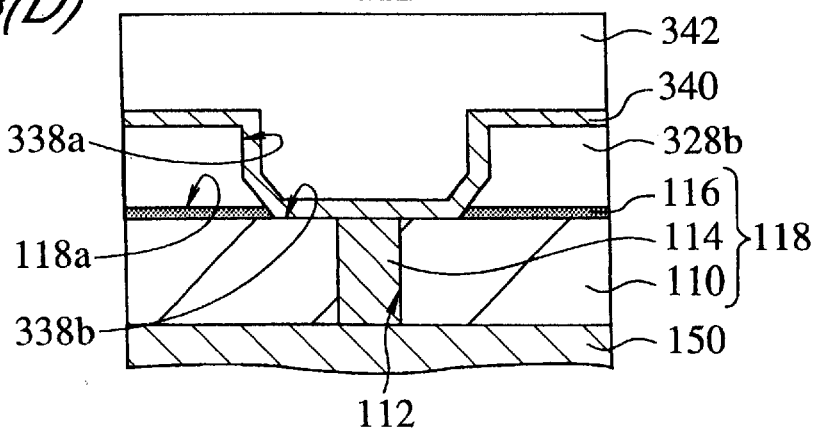

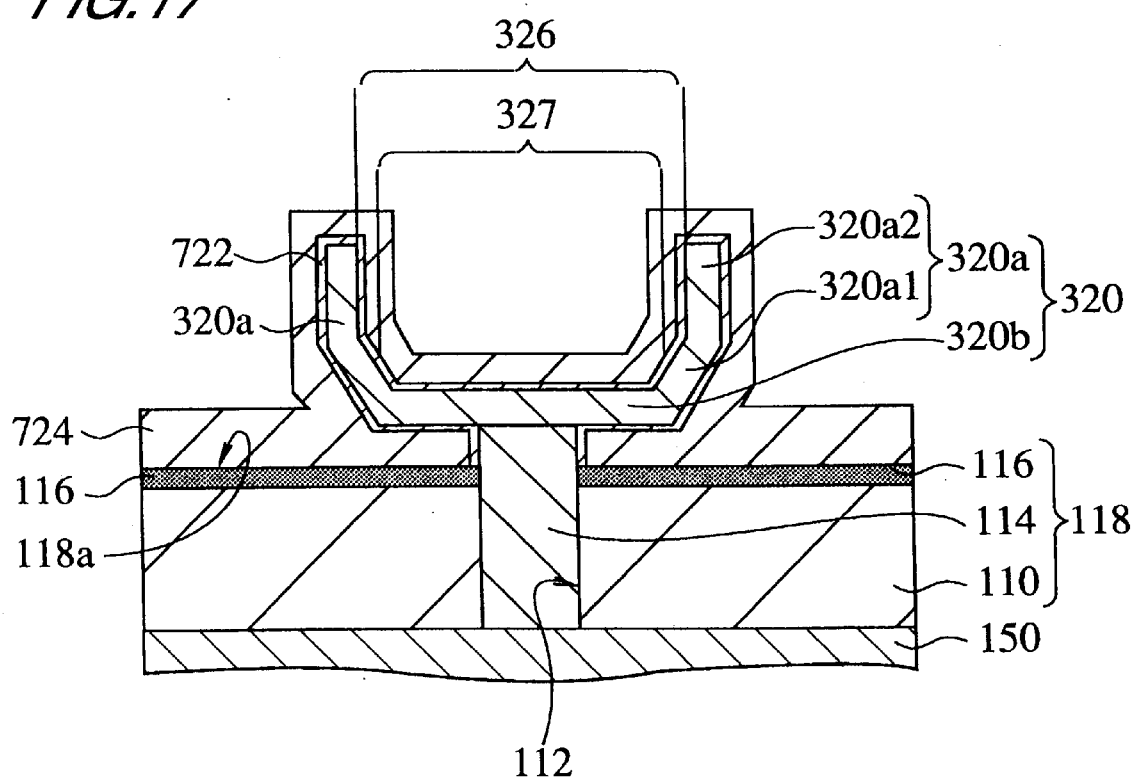

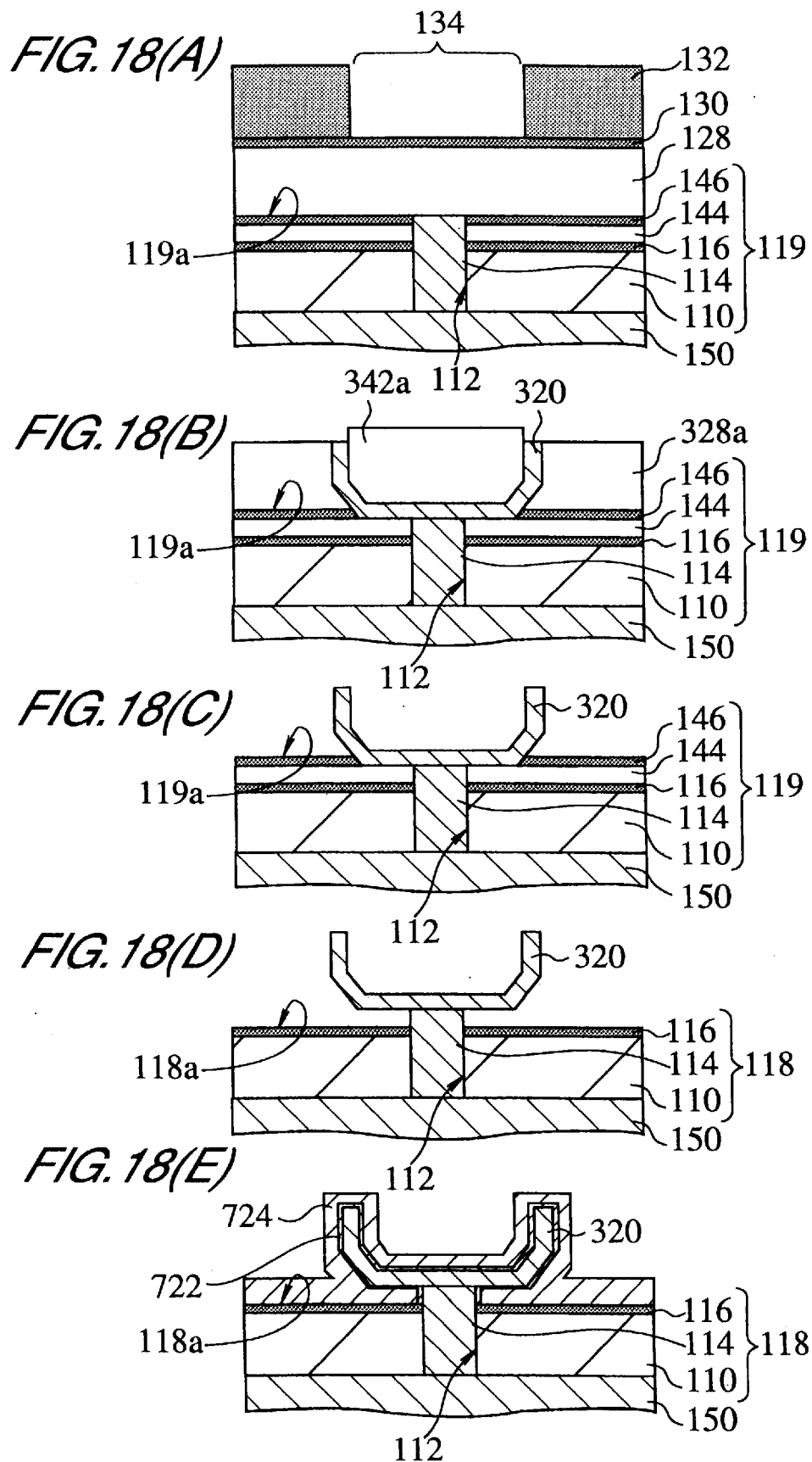

SEMICONDUCTOR DEVICE HAVING A LOWER ELECTRODE APERTURE THAT IS LARGER THAN THE PHOTOLITHOGRAPHY RESOLUTION OF THE CAPACITOR PATTERN

BACKGROUND OF THE INVENTION

1. Field of the Invention

The present invention relates to a semiconductor device, and more particularly to a cylindrical memory cell which is provided a capacitor, and the method for the manufacture thereof.

2. Description of Related Art

The conventional method for manufacturing this type of semiconductor device will be explained with reference to FIGS. 21 and 22. FIGS. 21 and 22 are schematic cross sectional views of the principal portion of a semiconductor device for explaining the conventional manufacturing process, respectively.

An interlayer insulating film 10 is formed on an appropriate semiconductor substrate 50. A silicon nitride film 16 is formed on this interlayer insulating film 10. A cell contact hole 12 is formed to pass through the silicon nitride film 16 and interlayer insulating film 10; this cell contact hole 12 is filled with polysilicon to form a plug 14. An underlying layer 18 is composed of the silicon nitride film 16 and the interlayer insulating film 10, wherein the plug 14 is formed. A silicon dioxide film 28 is formed on the principal surface 18a of the underlying layer 18. A resist film 32 is formed on the upper surface of the silicon dioxide film 28. Photolithography is used to pattern this resist film 32 and a round opening is created as the capacitor pattern 34 (FIG. 21(A)).

Next, the resist film 32 having formed therethrough the capacitor pattern 34, is used as a mask and an isotropic etching is used to form a circular pocket or groove 38 in the silicon dioxide film 28 (FIG. 21(B)). After the removal of the resist film 32, a polysilicon film 40 is formed on the remaining silicon dioxide film 28a (FIG. 21(C)). To provide the prescribed conductivity, impurities are dispersed in this polysilicon film 40. In the pocket 38, a polysilicon film 40 is formed on the pocket wall surface and pocket floor surface. A silicon dioxide film 42 is further deposited on the polysilicon film 40 (FIG. 21(D)). Portions of the silicon dioxide film 42 outside of the pocket 38 are removed with a surface etch (or etching back) or with CMP (chemical mechanical polishing). Silicon dioxide film 42a is thereby left within the pocket 38 while the surface of the polysilicon film 40 is exposed (FIG. 22(A))

The remaining silicon dioxide film 42a is used as a mask and a surface etch of the polysilicon film 40 is performed. This etch removes the portion of the polysilicon film 40 which is layered on the upper surface of the silicon dioxide film 28a. The polysilicon film 40 remains only on the pocket wall surface 38b and pocket floor surface 38a of the pocket 38. The remaining polysilicon film 40 becomes a storage electrode 20 (FIG. 22(B)). The silicon dioxide films 28a and 42a are then selectively removed by etching with hydrofluoric acid (HF), for example, with the silicon nitride film 16 acting as a stopper. Afterwards, a capacitor insulating film 22 is formed on the surface of the storage electrode 20. A polysilicon film wherein impurities are dispersed is formed on the surface of the capacitor insulating film 22 to thereby form a cell plate electrode 24 (FIG. 22(C)). In this way, a cylindrical memory cell, wherein the inner diameter of the storage electrode is essentially the same as the capacitor pattern 34, is formed.

As memory cells have become smaller, capacitor patterns have becomes smaller, as have the capacitors formed thereby. Sufficient capacity cannot be attained with memory cells formed using the conventional method discussed above because the reduction in size has caused a reduction in capacitor area. To increase capacity, it is necessary to increase the height of the capacitor (height h shown in FIG. 22(C)). This results in a large step between the memory cell portion and the surrounding circuit portions and makes photolithography difficult. Manufacturing memory cells with a high yield therefore becomes difficult.

SUMMARY OF THE INVENTION

It is an object of the present invention to provide a semiconductor device which is provided a capacitor with sufficient capacity and having a small difference in the levels of the memory cell portion and the surrounding area.

It is another object of the present invention to provide a method for manufacturing semiconductor devices, with which it is possible to form capacitors with sufficient capacity and without increasing the step between the memory cell portion and the surrounding area to a degree that makes photolithography difficult.

According to a first principal aspect of the present invention, there is provided a semiconductor device having the following constitution and which is provided a capacitor comprising first and second electrodes and a dielectric layer therebetween. The first electrode is formed as follows: an insulating film and resist film are formed on the principal surface of the underlying layer; photolithography is used to form a capacitor pattern in this resist film; the insulating film is etched with the mask being the resist film wherein this capacitor pattern is formed; a pocket is formed; and a conductive film is formed on the pocket wall surface and pocket floor surface of this pocket. This capacitor pattern is the first opening. The aperture area of this pocket is larger than the aperture area of the capacitor pattern. The aperture area of the second opening, delimited by the wall portion of the first electrode attained when a conductive film is formed on the pocket side walls, thereby becomes greater than the aperture area of the first opening.

Consequently, the aperture area of the pocket, wherein the conductive layer forming the first electrode is formed, is greater than the area of the capacitor pattern determined by the resolution of photolithography. The second opening of the first electrode is formed as a circle concentric to the first opening. The aperture area of the second opening is greater than the aperture area of the first opening.

In embodiments of the present invention, the aperture area of the second opening is preferably greater than the aperture area of the opening determined by the resolution limit of photolithography discussed above.

According to a second principal aspect of the present invention, there is provided a semiconductor device having the following constitution. In this semiconductor device, the aperture area of the pocket, at an intermediate vertical position located between the principal surface of the underlying layer and the upper surface of the insulating film, is greater than the aperture area of the capacitor pattern (first opening). The aperture area of the second opening, delimited by the middle of the wall portion of the first electrode attained when a conductive film is formed on the pocket side wall, thereby becomes greater than the aperture area of the first opening.

Consequently, at an intermediate position, at least, of the pocket wherein a conductive film to become the first electrode is layered, the aperture area is greater than the area of the capacitor pattern determined by the photolithography resolution. The aperture area of the second opening of the first electrode can thereby be made greater than the aperture area of the first opening.

"In embodiments of the present invention, the wall portion of the first electrode may be at an angle to the principal surface so that the aperture area of the second opening increases as the distance upwards from the underlying layer increases."

With such a constitution, the aperture area of the pocket, wherein the conductive film to become the first electrode is layered, becomes greater than the area of the capacitor pattern determined by the photolithography resolution.

In the preferred embodiments of the present invention, the lower portion may be at an angle to the principal surface so that the aperture area of the second opening, delimited by the lower portion of the wall portion, increases as the distance upwards from the underlying layer increases.

Also, in the preferred embodiments of the present invention, the upper portion may be at an angle to the principal surface so that the aperture area of the second opening, delimited by the upper portion of the wall portion, increases as the distance upwards from the underlying layer increases.

Also, in the preferred embodiments of the present invention, part of the dielectric layer may be formed between the principal surface and the lower surface of the floor portion of the first electrode, attained by depositing a conductive film on the floor portion of the pocket.

This constitution allows the capacitor area to be further increased.

It is a third principal aspect of the present invention to provide a method for manufacturing the semiconductor device discussed above.

This method comprises the following steps of:
forming a first insulating film, a second insulating film, and a resist film, in that order, on the principal surface of an underlying layer;
forming a first opening, as a capacitor pattern, in the resist film using photolithography;
forming an initial pocket in the first insulating film by patterning the second and first insulating films, in that order, with this resist film as a mask, and using anisotropic etching until the principal surface of the underlying layer is exposed;
cutting back the wall surface of the initial pocket and forming a pocket in the first insulating film by patterning the remaining first insulating film using isotropic etching, with the remaining second insulating film as a mask;
forming a conductive film on the wall surface and floor surface of the pocket;
patterning the conductive film and forming a first electrode; and
forming a dielectric layer and second electrode, in that order, on the first electrode.

The resolution of the exposure source used in photolithography is determined by the wavelength of the light used. G-line steppers, I-line steppers, and KrF steppers have progressively higher resolutions. Smaller patterns can be formed by using super resolving technology with improved masks, resists, and numerical aperture. Generally, each generation of technology has its resolution limit in pattern formation for efficient mass production. For example, a usual I-line stepper, which is used in mass production and can form the finest patterns at this time, can reliably form 0.35 $\mu$m patterns and cannot form patterns smaller than that. In this case, if a cell is 1 $\mu$m on a side (projection), a 0.65 $\mu$m-sized pattern is the greatest that can be formed. In this way, the photolithography resolution limit determines the size of the patterns which can be formed.

However, with the present invention, it is possible to form patterns of 0.75 $\mu$m by using isotropic etching. It is therefore possible to form patterns with large areas. In other words, an exposure source having 0.35 $\mu$m resolution can be used to form patterns with the same size as those formed with an exposure source having 0.25 $\mu$m resolution.

Consequently, the aperture area of the pocket, wherein is layered the conductive film to become the first electrode, can be formed to a size greater than the aperture area of the capacitor pattern determined by the resolution of photolithography. It is therefore possible to produce a capacitor with sufficient capacity, without the step between the memory cell portion and the surrounding portions becoming so large as to impede photolithography.

It is a fourth principal aspect of the present invention to provide a method for manufacturing the semiconductor device discussed above. This method comprises the following steps of:
forming a first insulating film, a second insulating film, and a resist film, in that order, on the principal surface of an underlying layer;
forming a first opening, as a capacitor pattern, in the resist film using photolithography;
forming an initial pocket in the second insulating film by patterning the second insulating film with this resist film as a mask and using anisotropic etching, until the upper surface of the first insulating film is exposed;
forming a pocket in the first insulating film by patterning the first insulating film using isotropic etching, with the second insulating film wherein the initial pocket is formed as a mask, until the principal surface of the underlying layer is exposed;
forming a conductive film on the wall surface and floor surface of the pocket;
patterning the conductive film and forming a first electrode; and
forming a dielectric layer and second electrode, in that order, on the first electrode.

This type of manufacturing can form a pocket in the first insulating film wherein the pocket wall surface is angled in relation to the principal surface. Consequently, the upper edge of the first electrode can be formed so that the second opening, at an intermediate position, has an aperture area larger than the aperture area of the first opening, which is determined by the photolithography resolution.

It is a fifth principal aspect of the present invention to provide a method for manufacturing the semiconductor device discussed above. This method comprises the following steps of:
forming a first insulating film, a second insulating film, and a resist film, in that order, on the principal surface of an underlying layer;
forming a first opening, as a capacitor pattern, in the resist film using photolithography;
forming an initial pocket in the first insulating film by patterning the second and first insulating films, in that order, with this resist film as a mask and using anisotropic etching until partway through the first insulating film;

forming a pocket in the first insulating film by patterning the first insulating film, wherein the initial pocket is formed, using isotropic etching, with the remaining second insulating film as a mask, until the principal surface of the underlying layer is exposed;

forming a conductive film on the wall surface and floor surface of the pocket;

patterning the conductive film and forming a first electrode; and forming a dielectric layer and second electrode, in that order, on the first electrode.

With this type of manufacturing, the wall surface of the pocket, in the lower portion of the pocket, is angled in relation to the principal surface. Consequently, the upper portion of the first electrode can be formed so that the second opening, at the lower portion of the first electrode, has an aperture area larger than the aperture area of the first opening, which is determined by the photolithography resolution.

It is a sixth principal aspect of the present invention to comprise the following processes. This method comprises the following steps of:

forming a first insulating film, a second insulating film, and a resist film, in that order, on the principal surface of an underlying layer;

forming a first opening, as a capacitor pattern, in the resist film using photolithography;

forming a standard initial pocket in the second insulating film by patterning the second insulating film with this resist film as a mask and using anisotropic etching;

forming an initial pocket in the first insulating film by patterning the first insulating film using isotropic etching, with the second insulating film wherein the standard initial pocket is formed as a mask, until partway through the first insulating film;

forming a pocket in the first insulating film by patterning the first insulating film, wherein the initial pocket is formed, using anisotropic etching, with the remaining second insulating film as a mask, until the principal surface of the underlying layer is exposed;

forming a conductive film on the wall surface and floor surface of the pocket;

patterning the conductive film and forming a first electrode; and forming a dielectric layer and second electrode, in that order, on the first electrode.

With this type of manufacturing, the wall surface of the pocket, in the upper portion of the pocket, is angled in relation to the principal surface. Consequently, the aperture area of the second opening, at the upper portion of the first electrode, can be formed to a size larger than the aperture area of the first opening, which is determined by the photolithography resolution.

The embodiments of the present invention preferably include a process to form the underlying layer, wherein a preliminary underlying layer including a third insulating film as an intermediate insulating layer is formed in advance; and between the steps of forming the first electrode and the steps of forming the dielectric layer, the principal surface side of this preliminary underlying layer is etched until the intermediate insulating layer is exposed.

In the case of forming a capacitor using the first opening, having the same area as before, as the capacitor pattern and following any of the methods discussed above, the capacitor area can thereby be made greater than the conventional capacitor area in any of these cases.

BRIEF DESCRIPTION OF THE DRAWINGS

The foregoing and other objects, features and advantages of the present invention will be better understood from the following description taken in connection with accompanying drawings, in which:

FIG. 1 is a drawing to explain the first embodiment of the semiconductor device relating to the present invention.

FIG. 2 (including FIG. 2(A) through FIG. 2(D)) is a process diagram to explain the method for manufacturing the first embodiment of the semiconductor device relating to the present invention;

FIG. 4 is a drawing to explain the second embodiment of the semiconductor device relating to the present invention.

FIG. 7 is a drawing to explain the third embodiment of the semiconductor device relating to the present invention.

FIG. 8 (including FIG. 8(A) through FIG. 8(D)) is a process diagram to explain the method for manufacturing the third embodiment of the semiconductor device relating to the present invention;

FIG. 10 is a drawing to explain the fourth embodiment of the semiconductor device relating to the present invention.

FIG. 17 is a drawing to explain the seventh embodiment of the semiconductor device relating to the present invention and is a schematic cross sectional view showing the principal elements of this semiconductor device; FIG. 18 (including FIG. 18(A) through FIG. 18(E)) is a process diagram to explain the method for manufacturing the seventh embodiment of the semiconductor device relating to the present invention;

DESCRIPTION OF THE PREFERRED EMBODIMENTS

Figure 1A:
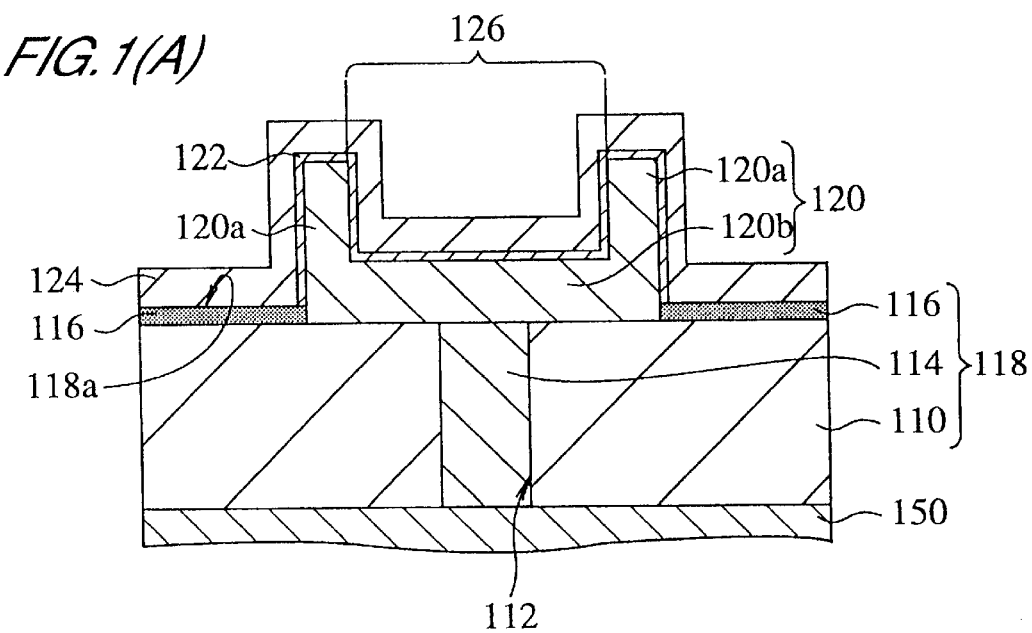
FIG. 1(A) is a schematic cross sectional view showing the principal elements of this semiconductor device

The embodiments of the present invention will be explained below with reference to the drawings. Moreover, the drawings schematically show only constitution, size, and arrangements of constitutional elements of the present invention to such an extent that the present invention can be understood. The numerical values and materials noted below are merely examples. Consequently, the present invention is not limited to these embodiments.

In the drawings shown below, with crosshatching or the like indicating cross sections are partially omitted. Each drawing shows only the principal elements of the semiconductor device relating to the present invention, specifically the principal elements of the memory cell.

First Embodiment

Figure 1B:
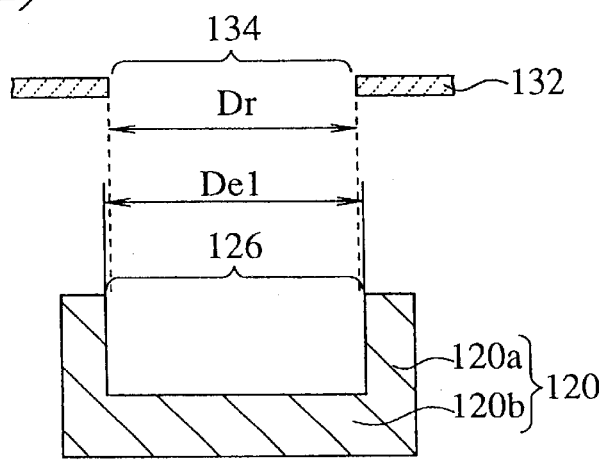
FIG. 1(B) is a drawing to explain the characteristics of this semiconductor device.
Figure 1C:
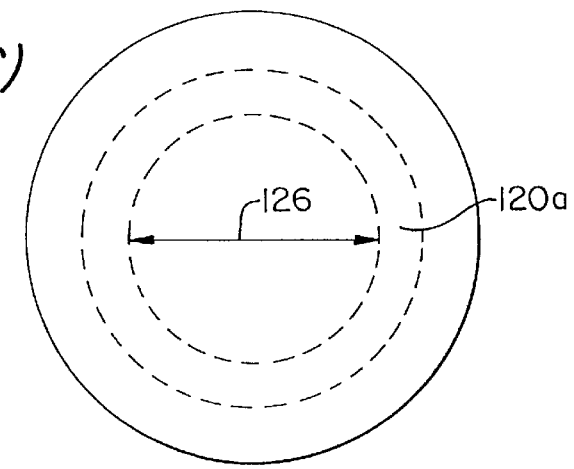
FIG. 1(C) is a top plan view of the cylindrical semiconductor device.

The constitution of the semiconductor device in the first embodiment will be explained with reference to FIG. 1(A). FIG. 1(A) is a cross sectional view showing the constitution of the semiconductor device relating to the first embodiment. FIG. 1(B) is a figure for explaining the sizes of the openings. FIG. 1(C) is a top plan view of the cylindrical device showing cylindrical lower storage electrode 120a as denoted by dotted lines and with aperture 126.

The semiconductor device in the present embodiment is provided an interlayer insulating film 110 formed of silicon dioxide, for example, on an appropriate semiconductor substrate 150. This semiconductor substrate 150 is roughly shown in the figure, but a desired constitutional element is prepared. A 10–30 nm (nanometer) thick silicon nitride film 116 is grown on the upper surface of the interlayer insulating film 110. A cell contact hole 112 is formed in the interlayer insulating film 110 and silicon nitride film 116; the cell contact hole 112 passes therethrough to the upper surface of the semiconductor substrate 150. A plug 114 is formed by filling the cell contact hole 112 with polysilicon, wherein prescribed impurities are dispersed. The plug 114 is a connective conductor and is for connecting the substrate 150 with the conductive layer or for connecting something other than the substrate 150 with the conductive layer. In the present embodiment, an underlying layer 118 comprises the silicon nitride film 116, the plug 114, and the interlayer insulating film 110, with the structure explained above. A capacitor structure is formed on the principal surface 118a of this underlying layer 118.

The capacitor structure is a layered structure comprising a first electrode (also referred to as a storage electrode or lower electrode) 120, a dielectric layer, specifically a capacitor insulating film 122, and a second electrode 124 (also referred to as a cell plate electrode or upper electrode). The first electrode 120 has a cup-shaped forms essentially a U-shaped cross section. The lower surface of the disk-shaped floor portion 120b is in contact with the principal surface of the underlying layer and the surface of the plug 114. The wall portion 120a is essentially perpendicular to the principal surface 118a. The wall portion 120a is cylindrical in form and the lower end thereof is in contact with the edge portion of the horizontal floor portion 120b. A capacitor insulating film 122 is formed on the surface of the first electrode 120. Furthermore, the second electrode 124 is formed on the capacitor insulating film 122.

Consequently, the capacitor area is dependent on the aperture area of the opening 126, delimited by the wall portion 120a of the first electrode 120. This opening 126 is referred to as the second opening. As clear from the explanation of the manufacturing method discussed below, a pocket is formed in the lower insulating layer using the first opening (capacitor pattern) formed in the resist film. The first electrode (storage electrode) is formed in this pocket. In the semiconductor device of the present embodiment, the aperture area of the pocket is greater than the aperture area of the first opening and essentially similar in form to the first opening, specifically the capacitor pattern. The aperture area of the second opening 126 therefore becomes greater than the aperture area of the first opening. In other words, as shown in FIG. 1(B), the diameter Dr of the first opening 134 in the resist layer 132 is less than the diameter $De_1$ of the second opening 126 in the first electrode 120. Normally, the size of the capacitor pattern is determined by the photolithography resolution limit and, therefore the size of the opening of this pocket is also limited by the resolution limit. However, with the manufacturing method explained next, the aperture area of the pocket for forming the first electrode can be made with a size greater than the resolution limit of the resist film.

Figure 3A:
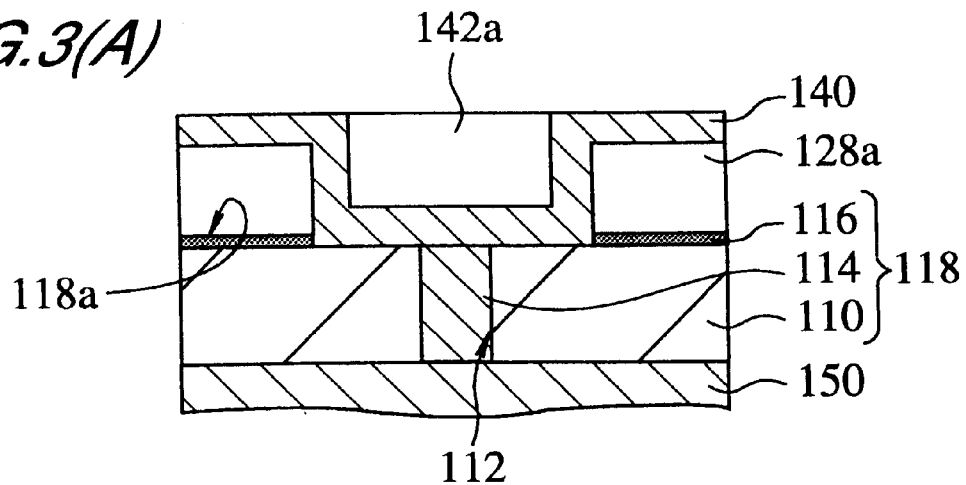
FIG. 3 (including FIG. 3(A) through FIG. 3(C)) is a continuation of FIG. 2.
Figure 3B:
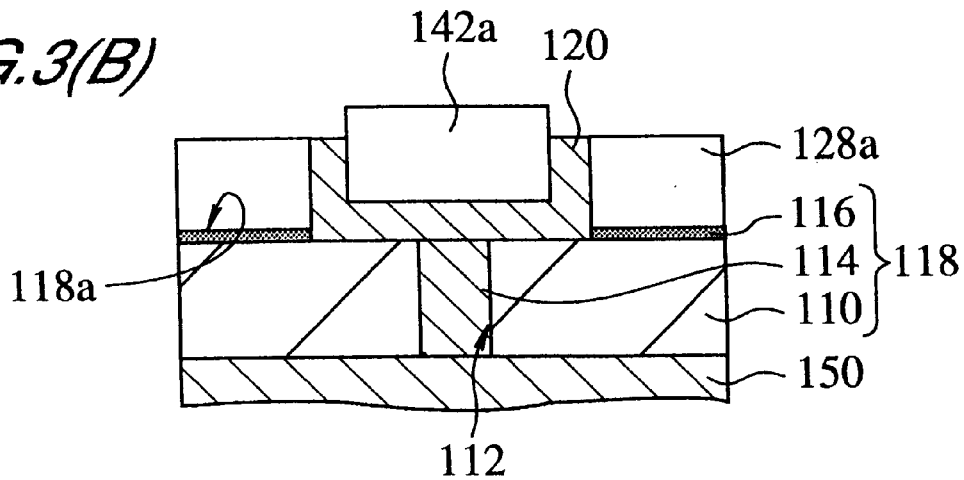
Figure 3C:
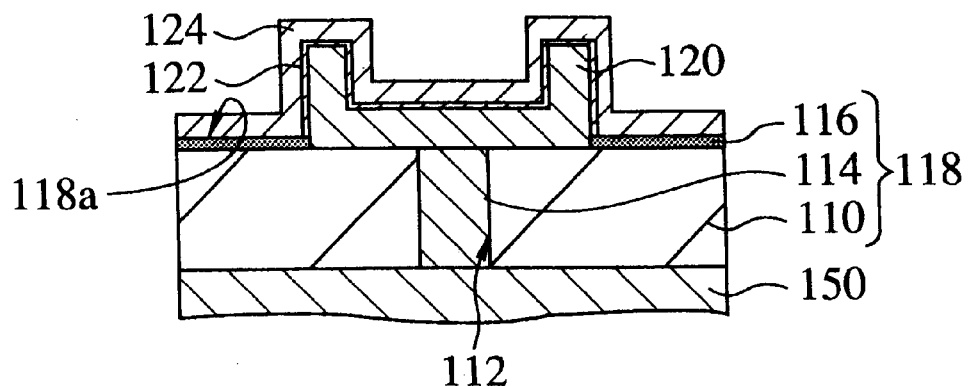

Next, the method for manufacturing the semiconductor device in the first embodiment is explained with reference to FIGS. 2 and 3.

An interlayer insulating film 110 is formed of silicon dioxide, for example, on an appropriate semiconductor substrate 150. A 10–30 nm thick silicon nitride film 116 is formed on the upper surface of this interlayer insulating film 110 using CVD (chemical vapor deposition). Next, a cell contact hole 112 is formed in the interlayer insulating film 110 and silicon nitride film 116; the cell contact hole 112 passes through these to the upper surface of the semiconductor substrate 150. A plug (connective conductor) 114 is formed by filling the cell contact hole 112 with polysilicon in which prescribed impurities are dispersed. The underlying layer 118 is formed in this way.

Next, an insulating film is formed on the principal surface 118a of the underlying layer 118 discussed above. In other words, a silicon dioxide film 128 as the first insulating film, a silicon nitride film 130 as the second insulating film, and resist film 132 are formed in that order. The silicon dioxide film 128 is 300–800 nm thick. The silicon dioxide film 128 and silicon nitride film 130 are formed using CVD. A first opening, specifically a capacitor pattern 134, is formed in the resist film 132 using photolithography (FIG. 2(A)). Specifically, a circular opening pattern 134 is formed in the resist film 132. Moreover, the silicon dioxide film 128 is an insulating film used to form the first electrode, as discussed below.

The resist film 132, wherein the capacitor pattern 134 is formed, is used as the etching mask. The silicon nitride film 130 and silicon dioxide film 128 are patterned, in that order, with anisotropic etching until the principal surface 118a of the underlying layer 118 is exposed. This anisotropic etching may be carried out with RIE (reactive ion etching), for example. In this process, an initial pocket or groove 136, in the shape of a cylindrical hole, is formed in the silicon dioxide film 128 (FIG. 2(B)). The opening of this initial pocket 136 has the same form and aperture area as the normal opening, specifically the resist pattern 134. The opening formed in the silicon nitride film 130 has essentially the same aperture area and form as the resist pattern 134; therefore, this is referred to as the second capacitor pattern 135. This second capacitor pattern 135 is a transfer pattern of the capacitor pattern 134.

Next, after the removal of the resist film 132, the remaining silicon nitride films 130a and 116 act as an etching mask and the remaining silicon dioxide film 128a is patterned with isotropic etching. This isotropic etching may be carried out with wet etching using hydrofluoric acid (HF), for example. When the hydrofluoric acid is used, the silicon dioxide film 128a can be selectively processed. As a result of isotropic etching, the pocket walls of the initial pocket 136 are cut away and a pocket 138 is formed in the silicon dioxide film 128a (FIG. 2(C)). This pocket 138 has an opening which is wider in a horizontal direction than the second capacitor pattern 135. The opening of the initial pocket 136 is wider by the length r shown in FIG. 2(C). The opening of the pocket 138 formed is wider than the initial pocket (corresponds to normal opening) 136. Consequently, the aperture area of this pocket 138 is greater than the area of the capacitor pattern 134. In this way, a pocket pattern can be formed with a size greater than the photolithography resolution limit.

After the removal of the silicon nitride film 130a and the exposed silicon nitride film 116, a polysilicon film 140 is formed as a conductive film on the floor surface 138a and wall surface 138b of the pocket 138 (FIG. 2(D)). Moreover, the floor surface 138b of the pocket is essentially a flat surface. Prescribed impurities, to provide conductivity, are dispersed in the polysilicon film 140, which becomes the storage electrode. The polysilicon film 140 is 50–100 nm thick. This polysilicon film 140 is formed using CVD. Moreover, the thickness of the polysilicon film 140 is established so that the diameter $De_1$ of the second opening explained in FIG. 1(B) becomes greater than the diameter Dr of the capacitor pattern (first opening) 134.

Next, the silicon dioxide film 142 is formed on the polysilicon film 140 (FIG. 2(D)). The silicon dioxide film 142 is formed to a thickness of 300–600 nm using CVD.

A surface etch of the silicon dioxide film 142 formed is then carried out. With this etch, the upper portion of the silicon dioxide film 142 is removed and part of the surface of the polysilicon film 140 is exposed. As a result, the silicon dioxide film 142a remains within the pocket 138 (FIG. 3(A)). The removal of the silicon dioxide film 142 may also be effected with CMP.

A surface etch of the polysilicon film 140 is performed with the remaining silicon dioxide film 142a as an etching mask. This etch removes part of the polysilicon film 140 which has accumulated on the upper surface of the silicon dioxide film 128a. The polysilicon film 140 remains only on the floor surface 138b and wall surface 138a of the pocket 138. The remaining polysilicon film becomes the storage electrode 120 (FIG. 3(B)).

Next, the silicon nitride film 116 acts as a stopper and the silicon dioxide films 128a and 142a are selectively removed with hydrofluoric acid, for example. Then, a capacitor insulating film 122 is formed on the surface of the storage electrode 120. Furthermore, a polysilicon film, wherein impurities are dispersed, is grown on the surface of the capacitor insulating film 122 and the second electrode, or cell plate electrode 124, is formed (FIG. 3(C)). In this way, a cylindrical memory cell is formed.

Consequently, with the method for manufacturing the semiconductor device of the present embodiment, the openings of the pockets 138 have the same form and area, regardless of the position of the pocket. The aperture area of the second opening 126 is made greater than the aperture area of the capacitor pattern 134. By regulating the thickness of the polysilicon film formed on this pocket 138, the aperture area of the second opening 126, delimited by the wall portion 120a of the storage electrode 120 attained on the pocket wall surface 138a, can be made greater than the aperture area of the first opening 134. (FIG. 1(B)).

As explained above, with the present embodiment, it becomes possible to form a pattern of a size exceeding the photolithography resolution limit by using isotropic etching. In other words, the area of the opening of the pocket 138, whereon the polysilicon film 140 to become the storage electrode 120 is accumulated, can be made larger than the area of the capacitor pattern determined by the photolithography resolution. As a result, a capacitor with sufficient capacity is attained without the step between the memory cell portion and the surrounding area becoming large enough to impede photolithography. The possibility of preparing memory cells with a high yield can therefore be anticipated.

Second Embodiment

Figure 4A:
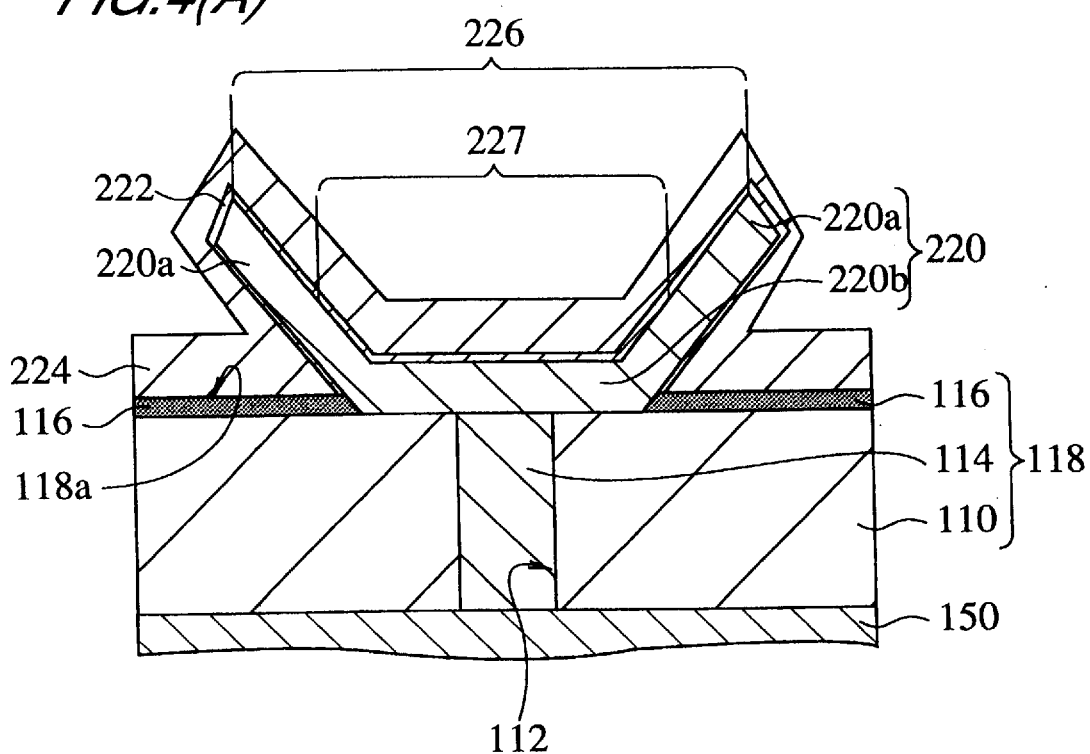
FIG. 4(A) is a schematic cross sectional view showing the principal elements of this semiconductor device and FIG. 4(B) is a drawing to explain the characteristics of this semiconductor device.
Figure 4B:
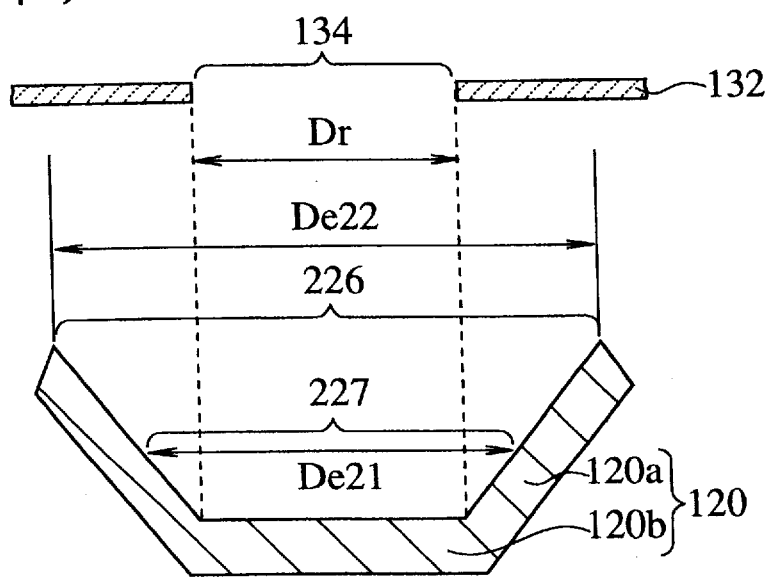

The constitution of the semiconductor device in the second embodiment will be explained with reference to FIG. 4. FIG. 4(A) is a cross sectional view showing the constitution of the semiconductor device relating to the second embodiment. FIG. 4(B) is a figure for explaining the sizes of the openings. In the second embodiment, the explanation mainly covers the processes and constitution which are different from the first embodiment and redundant explanations are not included.

In the semiconductor device of the present embodiment, the wall portion 220a of the first electrode (also referred to as the storage electrode or lower electrode) 220 is at an angle to the principal surface 118a of the underlying layer 118, as shown in FIG. 4(A). The wall portion 220a is formed in the shape of an umbrella and widens at the end, so that the aperture area of the second opening 227 delimited by the wall portions 220a becomes greater as the distance upwards from the underlying layer 118 increases. In other words, the storage electrode 220 is provided a flat floor portion 220b and an angled wall portion 220a which rises and opens outward from this floor portion. The opening 226 delimited by the upper edge of the storage electrode 220 is designated as a third opening. At an intermediate position on the angled wall portion 220a, the second opening has a diameter less than that of the third opening, but both diameters are equal at the upper edge.

The method for manufacturing the semiconductor device of this second embodiment will be explained with reference to FIGS. 5 and 6.

As explained with reference to FIG. 2(A), the underlying layer 118, first insulating film 128, second insulating film 130, and resist film 132, wherein a capacitor pattern 134 is established as the first opening, are formed in that order. The capacitor pattern 134 is formed in this resist film 132 using photolithography. In other words, a round opening pattern 134 is formed in the resist film 132 (FIG. 5(A)).

With the resist film 132, in which the capacitor pattern 134 is formed, as the etching mask, the silicon nitride film 130 is patterned using anisotropic etching until the upper surface of the silicon dioxide film 128 is exposed. In this way, an opening is formed as a second capacitor pattern in the silicon nitride film 130. This anisotropic etching may be carried out using an RIE method, for example. In this process, this opening is an initial pocket 236 in the shape of a cylindrical hole (FIG. 5(B)). This initial pocket 236 has an opening with the same area and form as the capacitor pattern 134 and consequently is a transfer pattern of the capacitor pattern 134.

Next, after the removal of the resist film 132, the silicon dioxide film (first insulating film) 128 is patterned with isotropic etching, with the etching mask being the second insulating film in which this initial pocket 236 is formed, specifically the remaining silicon nitride film 130a and silicon nitride film 116. This etching is carried out until the principal surface 118a of the underlying layer is exposed. This isotropic etching is carried out using a wet etching method using hydrofluoric acid, for example. The silicon dioxide film 128 can be selectively patterned when hydrofluoric acid is used. A pocket 238 is formed in the silicon dioxide film as a result of this isotropic etching (FIG. 5(C)). In the figure, the remaining silicon dioxide film is labeled 228a. Because the pocket 238 is formed using isotropic etching, the amount of material cut away from the upper portion of the pocket 238 is greater than that cut away from the lower portion; the opening is thereby widened. In other words, this pocket 238 is a hole in the shape of a truncated cone. The opening of the pocket 238 becomes wider in a horizontal direction than the opening of the initial pocket 236 by the length r shown in FIG. 5(C). The opening of the pocket 238 formed is wider than the initial pocket 236, and consequently the aperture area of this pocket 238 is greater than the aperture area of the capacitor pattern 134. In other words, a pocket pattern of a size greater than the photolithography resolution limit can be formed.

Figure 5A:
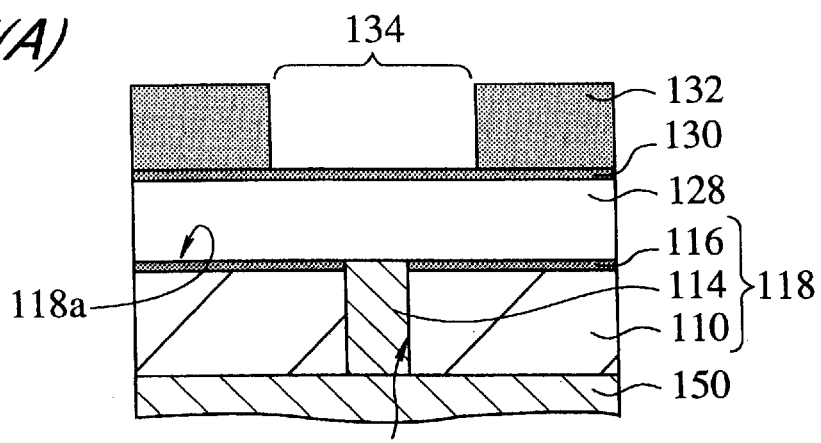
FIG. 5 (including FIG. 5(A) through FIG. 5(D)) is a process diagram to explain the method for manufacturing the second embodiment of the semiconductor device relating to the present invention.
Figure 5B:
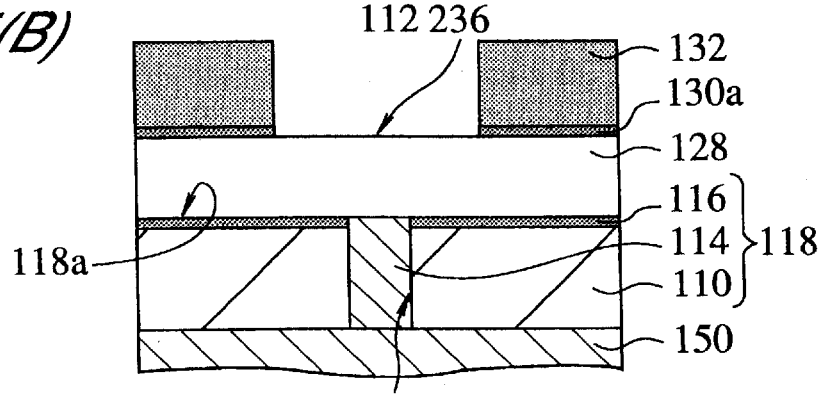
Figure 5C:
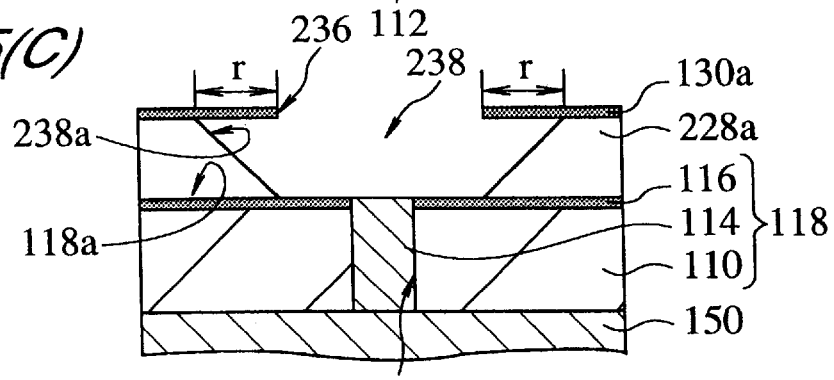
Figure 5D:
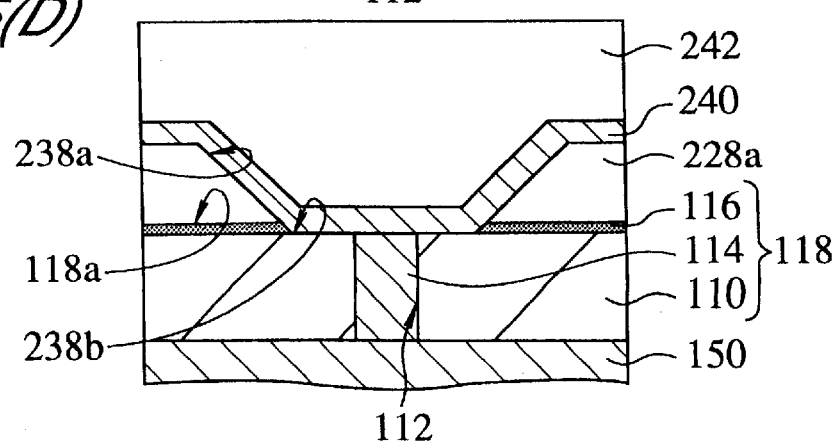
Figure 6A:
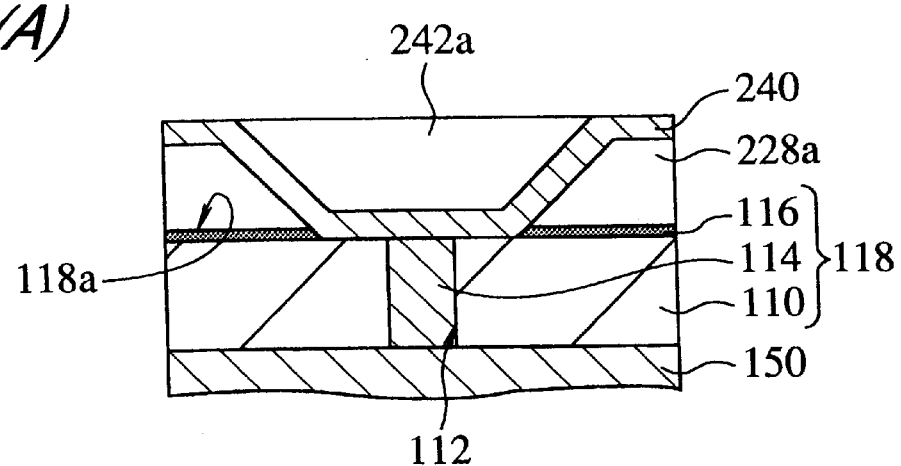
FIG. 6 (including FIG. 6(A) through FIG. 6(C)) is a continuation of FIG. 5.
Figure 6B:
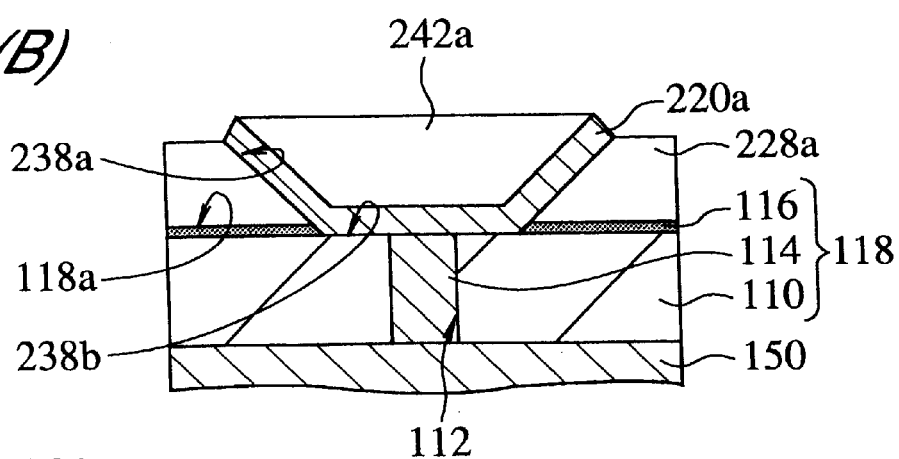
Figure 6C:
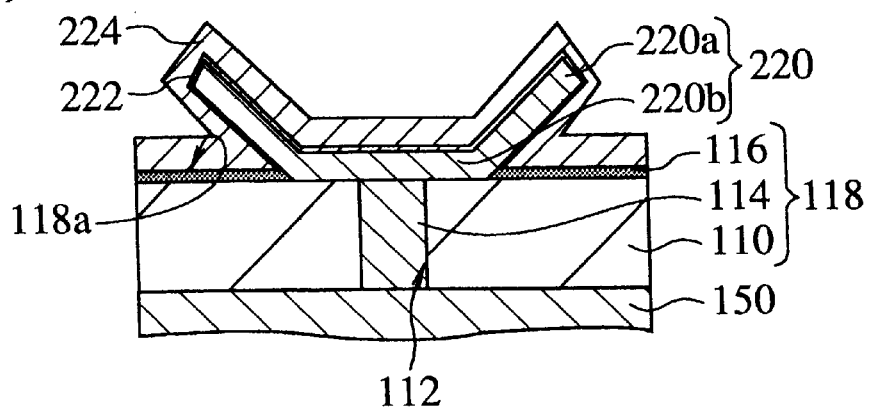

Following the removal of the remaining silicon nitride films 130a and 116, a polysilicon film 240 is formed an the wall surface 238a and floor surface 238b of the pocket 238 (FIG. 5(D). In order to provide conductivity, desired impurities are dispersed within the polysilicon film 240, which becomes the storage electrode. Also, a silicon dioxide film 242 is formed on the polysilicon film 240 in order for the patterning of the polysilicon film 240 and formation of the storage electrode (FIG. 5(D)).

Next, a surface etch of the silicon dioxide film 242 formed is carried out. The upper portion of the silicon dioxide film 242 is removed by this etch and part of the surface of the polysilicon film 240 is exposed. As a result, the silicon dioxide film 242a remains inside the pocket 238 (FIG. 6(A)).

Next, a surface etch of the polysilicon film 240 is performed with the remaining silicon dioxide film 242a as the etching mask. The polysilicon film 240 is patterned with this etching. In other words, part of the polysilicon film 240, which is accumulated on the upper surface of the remaining silicon dioxide film 228a, is removed. The polysilicon film 240 remains only on the wall portion 238a and floor portion 238b of the pocket 238, This remaining polysilicon film becomes the storage electrode 220 (FIG. 6(B)).

Next, with the silicon nitride film 116 around the storage electrode as a stopper, the remaining silicon dioxide films 228a and 242a are selectively removed with hydrofluoric acid, for example. The capacitor insulating film 222 is formed on the surface of the storage electrode 220. Further, a polysilicon film, wherein impurities are dispersed, is formed on the surface of the capacitor insulating film 222 and the cell plate electrode 224 is formed (FIG. 6(C)). A cylindrical memory cell is formed in this way.

Consequently, with the method for manufacturing the semiconductor device of this second embodiment, the area of the opening of the pocket 238, at an intermediate position on the wall surface between the principal surface 118a of the underlying layer 118 and the upper surface of the silicon dioxide film 228a, is made greater than the aperture area of the capacitor pattern 134. As a result of regulating the thickness of the polysilicon film formed in the pocket 238, the aperture area of the second opening 227 delimited by an intermediate position on the wall portion 220a of the storage electrode 220 is made greater than the aperture area of the first opening 134 (FIG. 4(A) and (B)). In order to realize the constitution discussed above, the wall portion 220a is angled with respect to the principal surface 118a so that the aperture area of the second opening 227 becomes greater as the distance upwards from the underlying layer 118 increases (FIG. 4(A) and (B)). In other words, as shown in FIG. 4(B), the diameter $De_{22}$ of the third opening 226, delimited by the upper edge within the angled wall portion 220a of the first electrode 220, or the diameter $De_{21}$ of the second opening 227, delimited by an intermediate position of this wall portion 220, is greater than the diameter Dr of the first opening 134.

The same type of effects as with the first embodiment discussed above are attained with the second embodiment. Additionally, the angling of the wall portion 220a can increase capacitor area, as well as further reduce the step between the memory cell portion and the surrounding area.

Third Embodiment

Figure 7A:
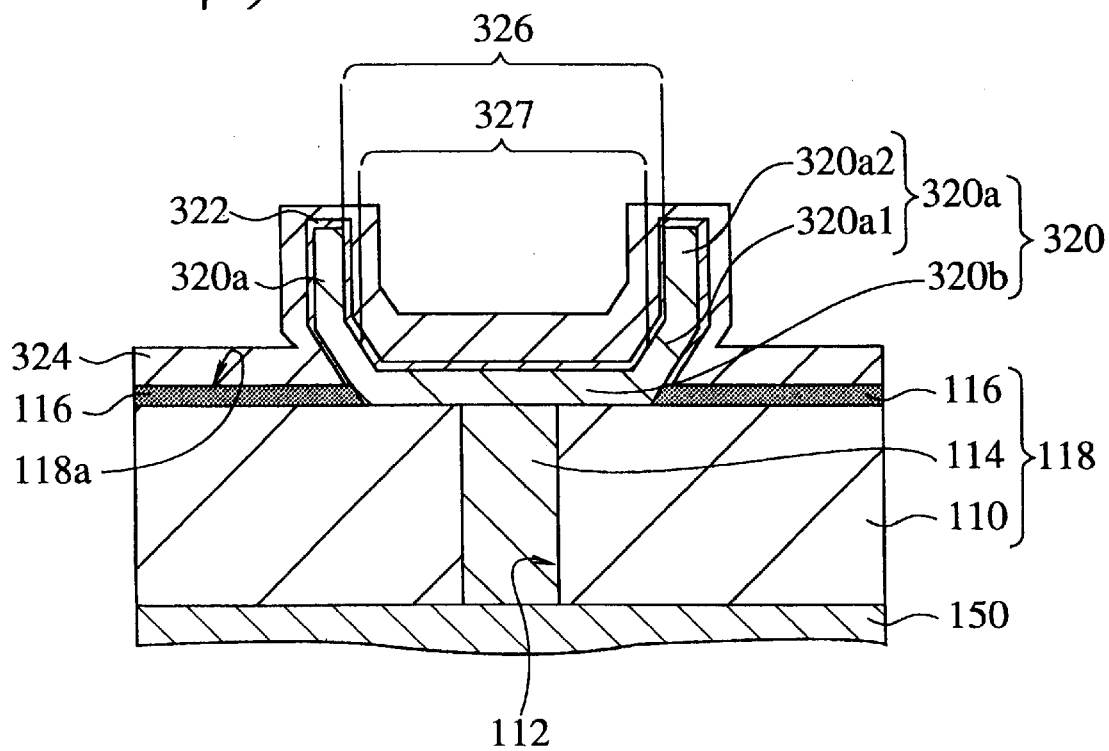
FIG. 7(A) is a schematic cross sectional view showing the principal elements of this semiconductor device and FIG. 7(B) is a drawing to explain the characteristics of this semiconductor device.
Figure 7B:
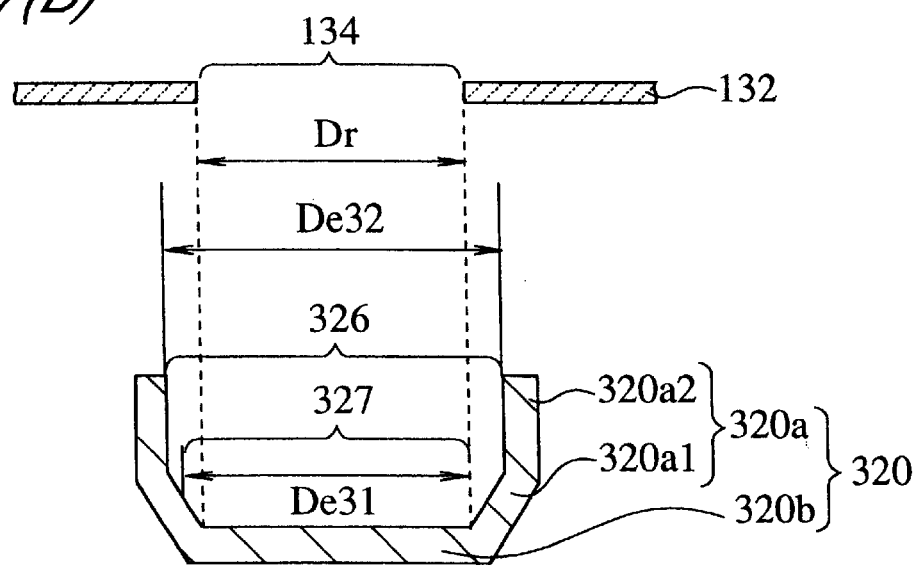

The constitution of the semiconductor device in the third embodiment will be explained with reference to FIG. 7(A) and (B). FIG. 7(A) is a cross sectional view showing the constitution of the semiconductor device relating to the third embodiment. FIG. 7(B) is a figure for explaining the sizes of the openings. In the third embodiment, the explanation mainly covers the processes and constitution which are different from the first embodiment and redundant explanations are not included.

In the semiconductor device of the third embodiment, the wall portion 320a of the storage electrode 320, which is the first electrode, comprises a lower portion $320a_1$ and an upper portion $320a_2$, as shown in FIG. 7(A). The lower portion $320a_1$ is put at an angle to the principal surface 118a of the underlying layer 118. This lower portion $320a_1$ is formed in the shape of an umbrella and widens at the end, so that the area of the second opening 327 formed thereby becomes greater as the distance upwards from the underlying layer 118 increases. In this example, this lower portion $320a_1$ is called the angled portion. The upper portion $320a_2$, connected to the upper end of this lower portion $320a_1$, is established perpendicular to the principal surface 118a so as to form a normal cylinder. In this example, the upper portion $320a_2$ is called the perpendicular portion.

Figure 9A:
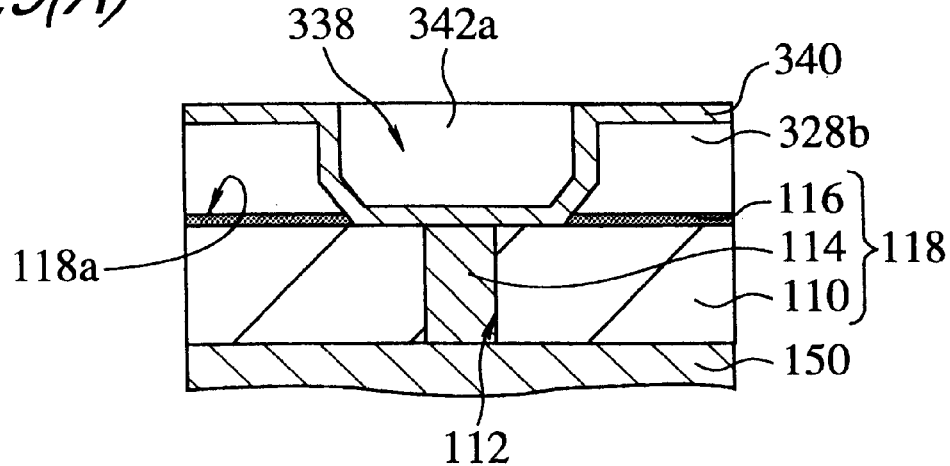
FIG. 9 (including FIG. 9(A) through FIG. 9(C)) is a continuation of FIG. 8.
Figure 9B:
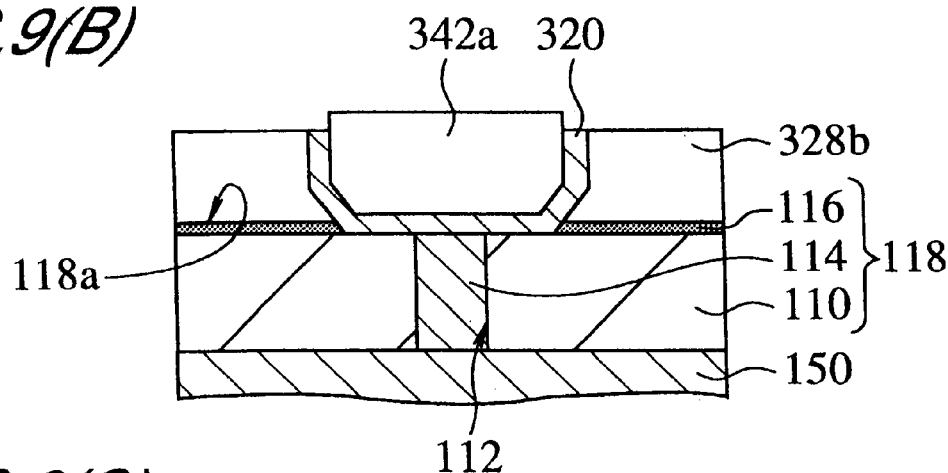
Figure 9C:
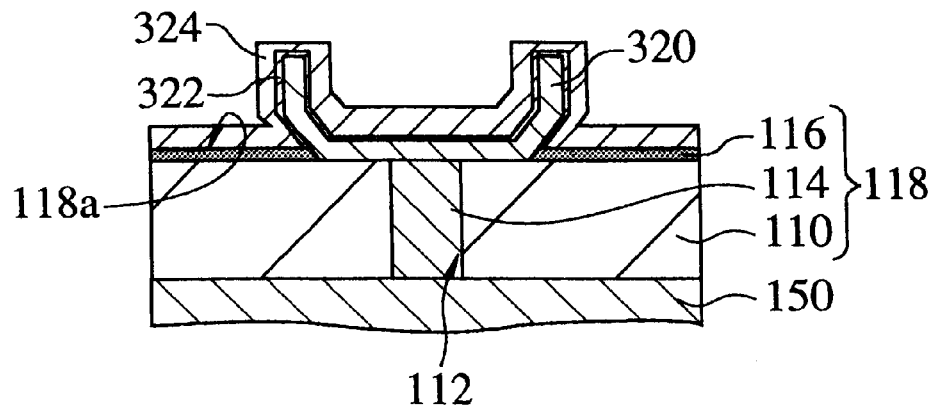

The method for manufacturing the semiconductor device of the third embodiment will be explained with reference to FIGS. 8 and 9.

As explained with reference to FIG. 2, the underlying layer 118, first insulating film 128, second insulating film 130, and resist film 132, wherein a capacitor pattern 134 is established as the first opening, are formed in that order (FIG. 8(A)).

With the resist film 132, in which the capacitor pattern 134 is formed, as the etching mask, the silicon nitride film 130 and silicon dioxide film 128 as the second insulating film are patterned, in that order, using anisotropic etching until partway through the silicon dioxide film 128. This anisotropic etching may be carried out using an RIE method, for example. In this process, this opening is an initial pocket 336 in the shape of a cylindrical hole formed in the silicon dioxide film 128 (FIG. 8(B)). In the figure, the remaining silicon dioxide film is labeled 328a. In this case as well, the opening 135 is formed as a second capacitor pattern in the silicon nitride film 130. This second capacitor pattern 135 is a transfer pattern of the capacitor pattern 134.

Moreover, this initial pocket 336 may be formed so that the floor portion thereof is located at a position halfway through the remaining silicon dioxide film 328a. In other words, the initial pocket is formed so as to reach a position at a depth halfway through the film from the upper surface of the remaining silicon dioxide film 328a. For this reason, in the etching process, etching time is calculated on the basis of the etching rate and the time is controlled.

The remaining silicon dioxide film 328a is patterned using isotropic etching, with the etching mask being the remaining silicon nitride film 130a and silicon nitride film 116. This isotropic etching is carried out with a wet etching method using hydrofluoric acid, for example. The silicon dioxide film 328a can be selectively patterned when hydrofluoric acid is used. This etch is carried out until the principal surface 118a of the underlying layer 118 is exposed. A pocket 338 is formed in the remaining silicon dioxide film 328b as a result of this isotropic etching (FIG. 8(C)). Because the pocket 338 is formed using isotropic etching, the wall portion of the initial pocket 336 recedes by the length r in a horizontal direction and the opening is widened. Also, the amount of material cut away from the upper portion of the hole formed below the initial pocket 336 is greater than that cut away from the lower portion. As a result, the opening of the hole becomes wider as the distance upwards from the principal surface 118a increases. Consequently, the pocket 338 formed comprises a cylindrical hole with a hole in the form of a truncated cone therebeneath and the opening is wider than the initial pocket 336. Consequently, the aperture area of this pocket 338 is greater than the aperture area of the capacitor pattern 134. In other words, a pocket pattern of a size greater than the photolithography resolution limit can be formed.

Next, following the removal of the remaining silicon nitride films 130a and 116, a polysilicon film 340 is formed on the wall surface 338a and floor surface 338b of the pocket 338 (FIG. 8(D)). In order to provide conductivity, desired impurities are dispersed within the polysilicon film 340, which becomes the storage electrode. Also, a silicon dioxide film 342 is formed on the polysilicon film 340 in order for the patterning of the polysilicon film 340 and formation of the storage electrode (FIG. 8(D)).

Next, a surface etch of the silicon dioxide film 342 formed is carried out. The upper portion of the silicon dioxide film 342 is removed by this etch and part of the surface of the polysilicon film 340 is exposed. As a result, the silicon dioxide film 342a remains inside the pocket 338 (FIG. 9(A)).

Next, a surface etch of the polysilicon film 340 is performed with the remaining silicon dioxide film 342a as the etching mask. The portion of the polysilicon film 340, which is accumulated on the upper surface of the silicon dioxide film 328b, is removed by this etch. The polysilicon film 340 remains only on the wall portion 338a and floor portion 338b of the pocket 338 This remaining polysilicon film 340 becomes the storage electrode 320 (FIG. 9(B)). The storage electrode 320 comprises a wall portion 320a and a horizontal floor portion 320b. The wall portion 320a of the storage electrode 320 is provided an angled portion $320a_1$ and a perpendicular portion $320a_2$ which is connected as a unit therewith.

Next, with the silicon nitride film 116 as a stopper, the silicon dioxide films 328b and 342a are selectively removed with hydrofluoric acid, for example. The capacitor insulating film 322 is formed on the surface of the storage electrode 320. Further, a polysilicon film, wherein impurities are dispersed, is formed on the surface of the capacitor insulating film 322 and the cell plate electrode 324 is formed (FIG. 9(C)). A cylindrical memory cell is formed in this way.

Consequently, with the method for manufacturing the semiconductor device of this third embodiment, the aperture area of the pocket 338, at any position vertically between the principal surface 118a of the underlying layer 118 and the upper surface of the silicon dioxide film 328b, or at least at a middle position on the lower side, is made greater than the aperture area of the capacitor pattern 134. The thickness of the polysilicon film formed in the pocket 338 is regulated. As a result, at the upper portion of the wall portion 320a of the storage electrode 320, the aperture area of the second opening 327 delimited by the lower portion is made greater than the aperture area of the first opening 134 (FIG. 7(A) and (B)). In order to realize the constitution discussed above, the angled portion $320a_1$ of the wall portion 320a, on the side toward the underlying layer 118, is angled with respect to the principal surface 118a so that the area of the second opening 327, at a vertical position on the side toward the underlying layer 118, becomes greater as the distance upwards from the underlying layer 118 increases (FIG. 7(A) and (B)). In other words, the diameter $De_{32}$ of the third opening 326, delimited by the perpendicular portion $320a_2$ of the first electrode 320, or the diameter $De_{31}$ of the second opening 327, delimited by the angled portion $320a_1$, is greater than the diameter Dr of the first opening 134. Moreover, the diameters $De_{31}$ and Dr are equal to each other at a connection point between the horizontal floor portion 320b and the angled portion $320a_1$. The diameters $De_{31}$ and $De_{32}$ are equal to each other at a connection point between the angled portion 320a and the perpendicular portion $320a_2$.

The same type of effects as with the first and second embodiments discussed above are attained with this third embodiment. The length of the angled portion $320a_1$ of the wall portion 320a is short as compared to the constitution of the second embodiment. As a result, there is no risk of the storage electrode 320 separating.

Fourth Embodiment

Figure 10A:
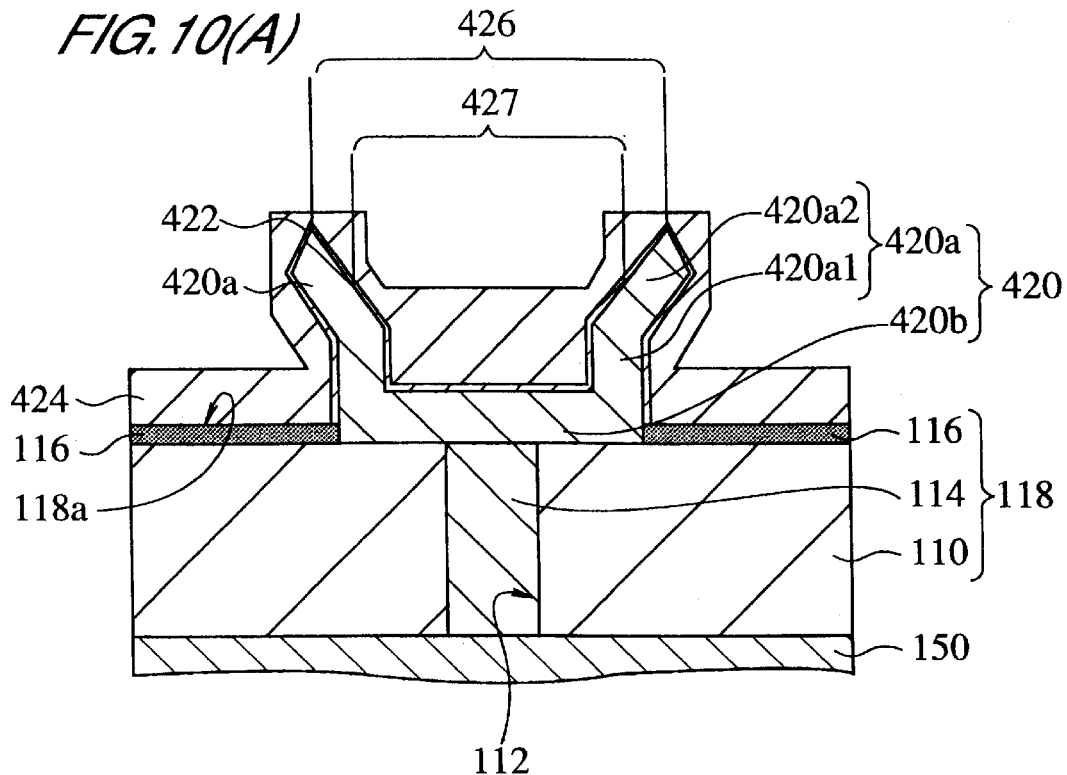
FIG. 10(A) is a schematic cross sectional view showing the principal elements of this semiconductor device and FIG. 10(B) is a drawing to explain the characteristics of this semiconductor device.
Figure 10B:
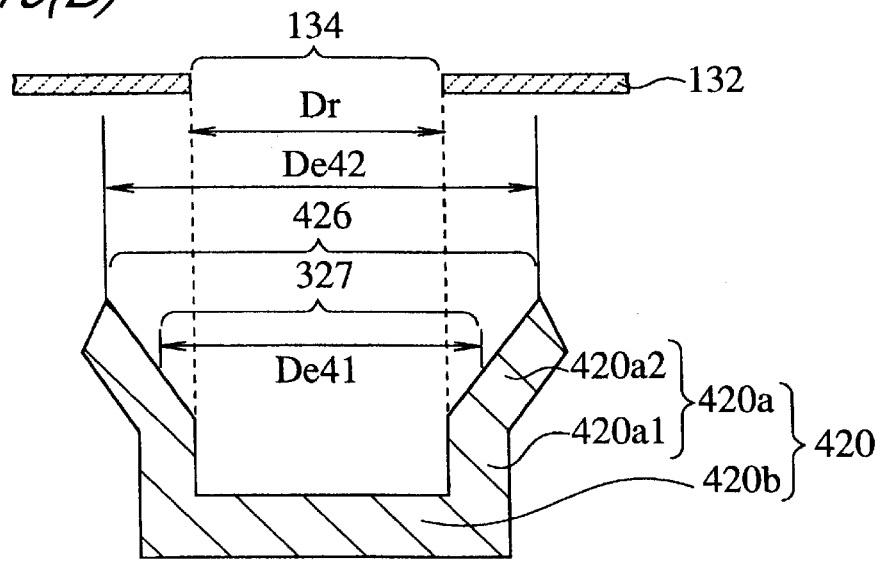

The constitution of the semiconductor device in the fourth embodiment will be explained with reference to FIG. 10(A) and (B). FIG. 10(A) is a cross sectional view showing the constitution of the semiconductor device relating to the fourth embodiment. FIG. 10(B) is a figure for explaining the sizes of the openings. In the fourth embodiment, the explanation mainly covers the processes and constitution which are different from the first embodiment and redundant explanations are not included.

In the semiconductor device of the fourth embodiment, the wall portion 420a of the storage electrode 420, which is the first electrode, comprises a lower portion $420a_1$ and an upper portion $420a_2$, as shown in FIG. 10(A). The upper portion $420a_2$ is put at an angle to the principal surface 118a of the underlying layer 118. This upper portion $420a_2$ is formed in the shape of an umbrella and widens at the end, so that the aperture area of the second opening 427 formed thereby becomes greater as the distance upwards from the underlying layer 118 increases. In this example, this upper portion $420a_2$ is called the angled portion. The lower portion $420a_1$, connected to the lower end of this upper portion $420a_2$, is established perpendicular to the principal surface 118a so as to form a normal cylinder. In this example, the lower portion $420a_1$ is called the perpendicular portion.

The method for manufacturing the semiconductor device of the fourth embodiment will be explained with reference to FIGS. 11 and 12.

As explained with reference to FIG. 2, the underlying layer 118, first insulating film (silicon dioxide film) 128, second insulating film (silicon nitride film) 130, and resist film 132, wherein a capacitor pattern 134 is established as the first opening, are formed in that order. The silicon nitride film 130 undergoes anisotropic etching using this capacitor pattern 134 as a mask and a standard initial pocket (opening) 135, reflecting the capacitor pattern 134, is formed (FIG. 11(A)). In the figure, the remaining silicon nitride film is labeled 130a. The opening of this standard initial pocket 135 has the- same form and aperture area as the capacitor pattern 134; the standard initial pocket is therefore a second capacitor pattern. This anisotropic etching is carried out using RIE.

Next, after the removal of the resist film 132, the silicon dioxide film 128 is patterned using isotropic etching, with the etching mask being the remaining silicon nitride film 130a, until the silicon dioxide film 128 is partly removed. This isotropic etching is carried out using a wet etching method using hydrofluoric acid, for example. In this process, an initial pocket 436, having a widening shape wherein the opening becomes wider as the distance upwards from the underlying layer 118 increases, is formed in the silicon dioxide film 128 (FIG. 11(B)). In the figure, the remaining silicon dioxide film is labeled 428a. Because the initial pocket 436 is formed with isotropic etching, the amount of material cut away from the upper portion of the initial pocket 436 is greater than the amount cut away from the lower portion. The opening becomes wider in a horizontal direction by the length r than the opening of the standard initial pocket 135.

Moreover, this initial pocket 436 may be formed so that the floor portion thereof is located at a position halfway through the remaining silicon dioxide film 428a. In other words, the initial pocket 436 is formed so as to reach a position at a depth halfway through the film from the upper surface of the silicon dioxide film 428a. For this reason, in the etching process, etching time is calculated on the basis of the etching rate of the hydrofluoric acid and the time is controlled.

The silicon dioxide film 428a, in which the initial pocket 436 is formed, is patterned using anisotropic etching, with the etching mask being the remaining silicon nitride film 130a and silicon nitride film 116. This anisotropic etching is carried out using RIE, for example. This anisotropic etching is carried out until the principal surface 118a of the underlying layer 118 is exposed. Consequently, the silicon nitride film 116 is used as a film for endpoint detection. A pocket 438 is formed as a result of this anisotropic etching and the silicon dioxide film 428b remains (FIG. 11(C)). The upper portion of the pocket 438 formed becomes the structure which reflects the initial pocket 436. Also, the lower portion of the pocket 438 formed becomes a cylindrical hole having a wall portion perpendicular to the principal surface 118a. As explained above, because the aperture area of the initial pocket 436 is greater than the aperture area of the capacitor pattern 134, the aperture area of this pocket 438 becomes greater than the aperture area of the capacitor pattern 134. Consequently, a pocket pattern of a size greater than the photolithography resolution limit can be formed.

Figure 11A:
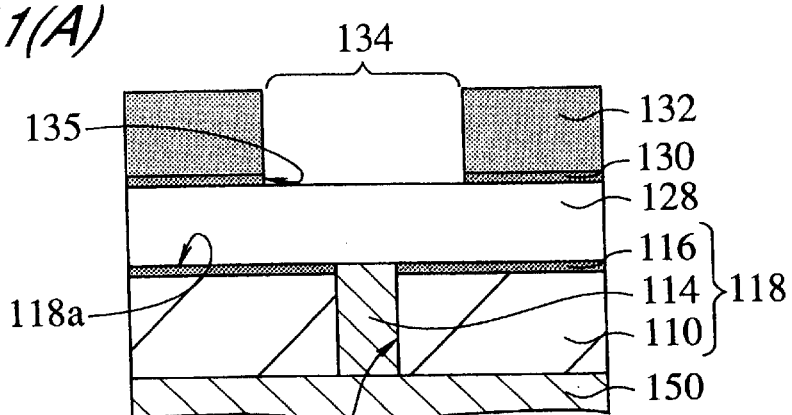
FIG. 11 (including FIG. 11(A) through FIG. 11(D)) is a process diagram to explain the method for manufacturing the fourth embodiment of the semiconductor device relating to the present invention.
Figure 11B:
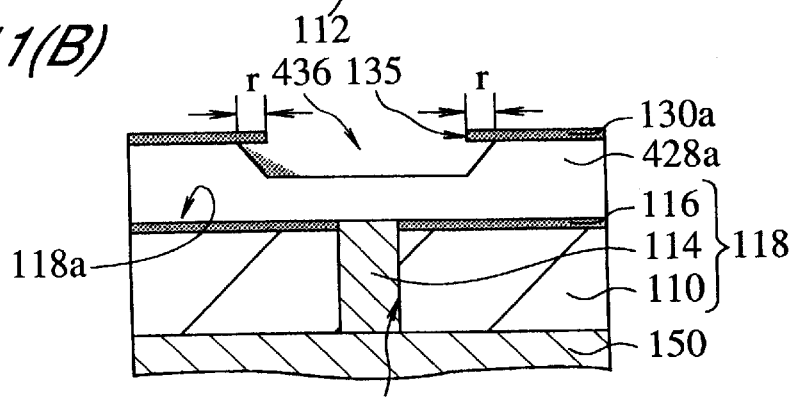
Figure 11C:
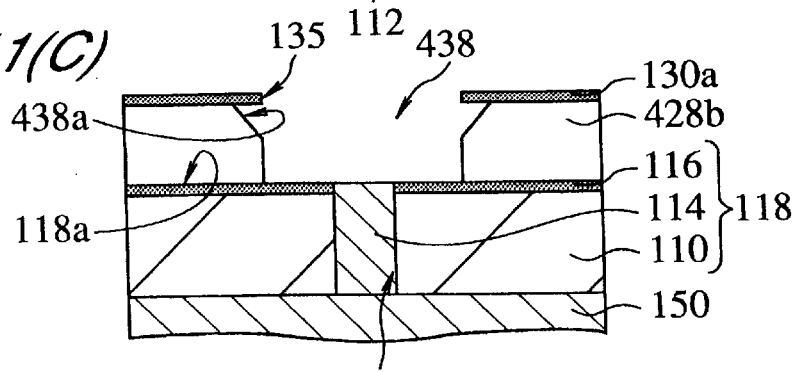
Figure 11D:
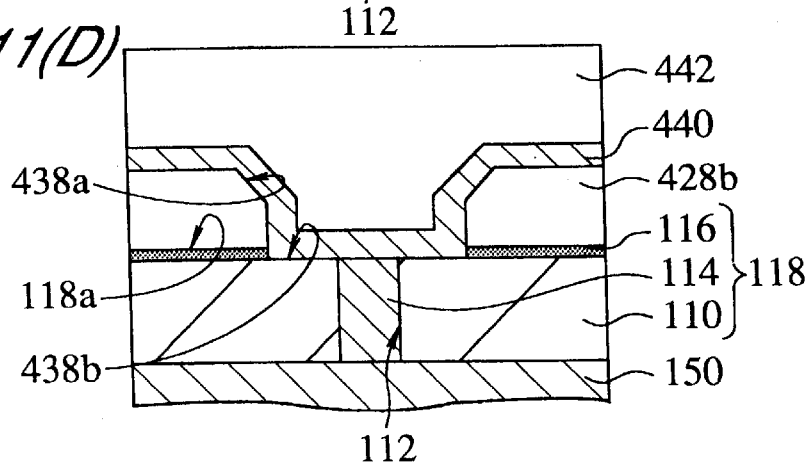
Figure 12A:
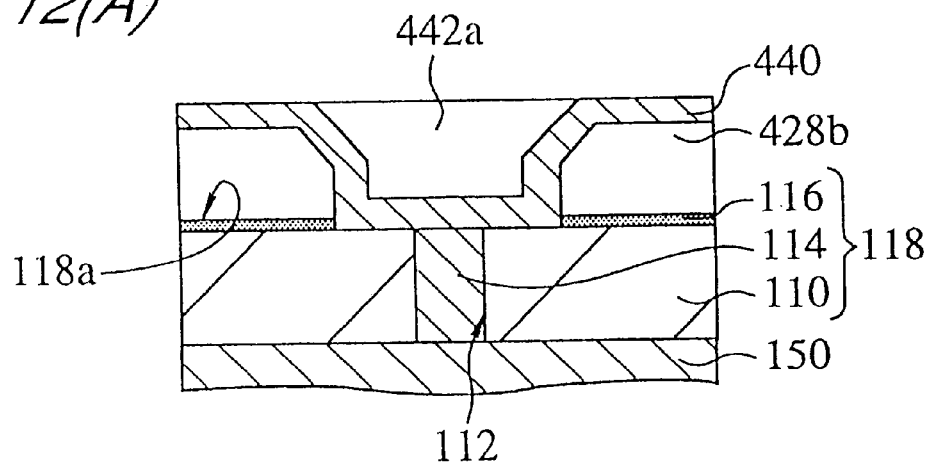
FIG. 12 (including FIG. 12(A) through FIG. 12(C)) is a continuation of FIG. 11.
Figure 12B:
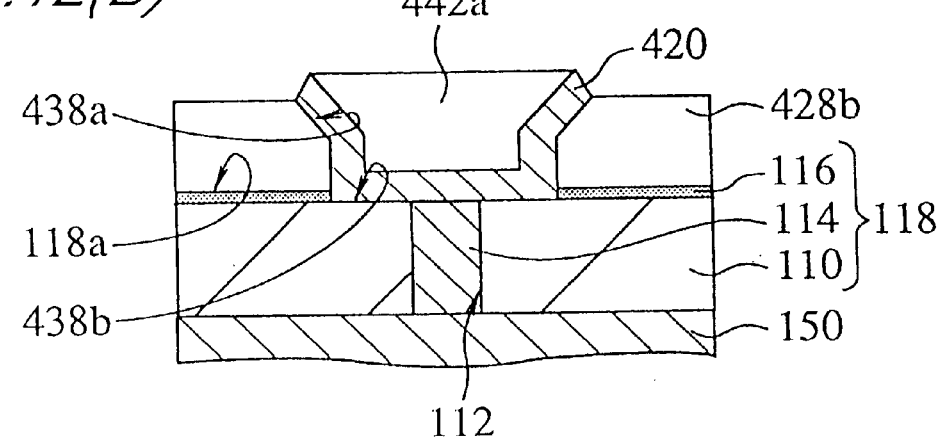
Figure 12C:
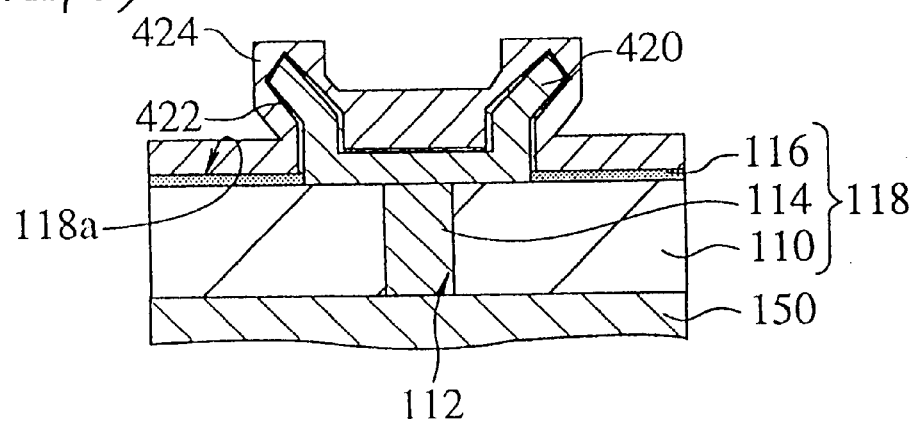

Next, following the removal of the remaining silicon nitride films 130a and the silicon nitride 116, a polysilicon film 440 is formed on the wall surface 438a and floor surface 438b of the pocket 438 (FIG. 11(D)). In order to provide conductivity, desired impurities are dispersed within the polysilicon film 440, which becomes the storage electrode. Also, a silicon dioxide film 442 is formed on the polysilicon film 440 in order for the patterning of the polysilicon film 440 and formation of the storage electrode (FIG. 11(D)).

Next, a surface etch of the silicon dioxide film 442 formed is carried out. The upper portion of the silicon dioxide film 442 is removed by this etch and part of the surface of the polysilicon film 440 is exposed. As a result, the silicon dioxide film 442a remains inside the pocket 438 (FIG. 12(A)).

A surface etch of the polysilicon film 440 is performed with the remaining silicon dioxide film 442a as the etching mask. The portion of the polysilicon film 440, which accumulated on the upper surface of the silicon dioxide film 428b, is removed by this etch. The polysilicon film 440 remains only on the wall portion 438a and floor portion 438b of the pocket 438. This remaining polysilicon film becomes the storage electrode 420 (FIG. 12(B)). The storage electrode 420 formed in this way is provided a wall portion 420a and floor portion 420b. The wall portion 420a is provided a perpendicular portion $420a_1$ and an angled portion $420a_2$ which is connected as a unit therewith (FIG. 10(A) and (B)).

Next, with the silicon nitride film 116 as a stopper, the silicon dioxide films 428b and 442a are selectively removed with hydrofluoric acid, for example. The capacitor insulating film 422 is formed on the surface of the storage electrode 420. Further, a polysilicon film, wherein impurities are dispersed, is formed on the surface of the capacitor insulating film 422 and the cell plate electrode 424 is formed (FIG. 12(C)). In this way, a cylindrical memory cell is formed.

Consequently, with the method for manufacturing the semiconductor device of this fourth embodiment, the aperture area of the pocket 438, at any vertical position between the principal surface 118a of the underlying layer 118 and the upper surface of the silicon dioxide film 428a, or at least above an intermediate position, is made greater than the aperture area of the capacitor pattern 134. The thickness of the polysilicon film 440 formed in the pocket 438 is regulated. As a result, the aperture area of the second opening 427 delimited by any position on the wall portion 420a of the storage electrode 420, or the aperture area of the second opening 427 formed at least at a middle position, is made greater than the aperture area of the first opening 134 (FIG. 10(A) and (B)). In order to realize the constitution discussed above, the wall portion $420a_2$ on the upper end of the storage electrode 420 is angled with respect to the principal surface 118a, so that the aperture area of the second opening 427 on the upper end of the storage electrode 420 becomes greater as the distance upwards from the underlying layer 118 increases (FIG. 10(A) and (B)). In other words, the diameter $De_{41}$ of the second opening 427, delimited by the perpendicular portion $420a_1$ or the angled portion $420a_2$ of the storage electrode 420, is greater than the diameter Dr of the first opening 134. Consequently, the diameter $De_{42}$ of the third opening 426 delimited by the upper edge of the angled portion 420$a_2$ is greater even than the diameter Dr of the first opening 134 (FIG. 10(A) and (B)). Moreover, even in this case, the second and third openings are the same at the upper edge of the angled portion 420$a_2$.

The same type of effects as with the first through third embodiments discussed above are attained with the fourth embodiment, as explained above.

Furthermore, in the third embodiment, endpoint detection during the anisotropic etching to form the pocket 338 (FIG. 8(C)) may become difficult and irregular. In the fourth embodiment, however, the silicon nitride film 116 can be used as the film for endpoint detection, as discussed above. Consequently, etching becomes easy and reproducible.

Fifth Embodiment

Figure 13:
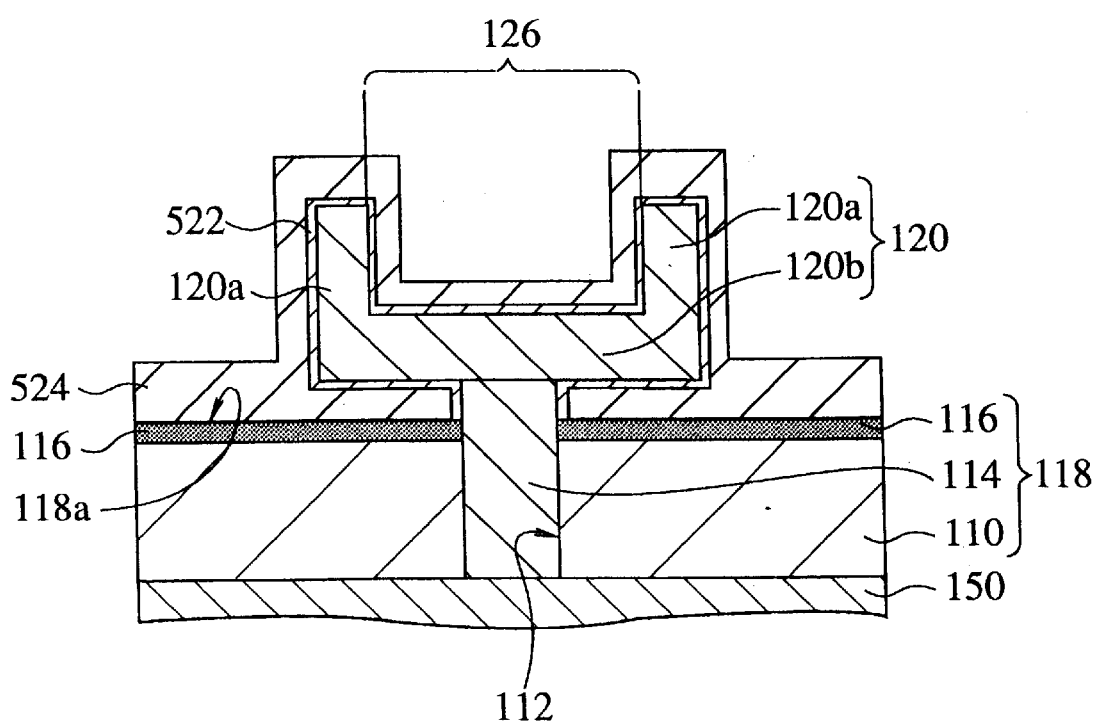
FIG. 13 is a drawing to explain the fifth embodiment of the semiconductor device relating to the present invention and is a schematic cross sectional view showing the principal elements of this semiconductor device.

The constitution of the semiconductor device in the fifth embodiment will be explained with reference to FIG. 13. FIG. 13 is a cross sectional view showing the constitution of the semiconductor device relating to the fifth embodiment. In the fifth embodiment, the explanation mainly covers the processes and constitution which are different from the first embodiment and redundant explanations are not included.

In the semiconductor device of the fifth embodiment, part of the capacitor insulating film 522, as the dielectric layer, is also formed between the principal surface 118a of the underlying layer 118 and the lower surface of the floor portion 120b of the storage electrode 120, as the first electrode, as shown in FIG. 13. Therefore, the floor portion 120b of the storage electrode 120 and principal surface 118a of the underlying layer 118 are separated vertically by a desired distance.

The method for manufacturing the semiconductor device of the fifth embodiment will be explained with reference to FIG. 14. FIG. 14 shows cross sectional views of the manufacturing processes for the fifth embodiment.

A preliminary underlying layer 119 is formed. Therefore, an interlayer insulating film 110, formed of silicon dioxide, for example, is formed on an appropriate semiconductor substrate 150. A 10–30 nm thick silicon nitride film 116 is formed using CVD on the upper surface of this interlayer insulating film 110. This silicon nitride film 116 is an intermediate insulating layer (third insulating film). Also, a 50–200 nm thick silicon dioxide film 144 is formed using CVD on the silicon nitride film 116. A 10–30 nm thick silicon nitride film 146 is formed using CVD on this silicon dioxide film 144. Then, a cell contact hole 112 is formed; the cell contact hole 112 passes through the interlayer insulating film 110, silicon nitride film 116, silicon dioxide film 144, and silicon nitride film 146, to the upper surface of the semiconductor substrate 150. A plug 114 is formed by filling this cell contact hole 112 with polysilicon wherein desired impurities are dispersed. The preliminary underlying layer 119 comprises the structure described above of the interlayer insulating film 110, plug 114, silicon nitride film 116, silicon dioxide film 144, and silicon nitride film 146. A capacitor structure is formed on the principal surface 119a of this preliminary underlying layer 119.

Figure 14A:
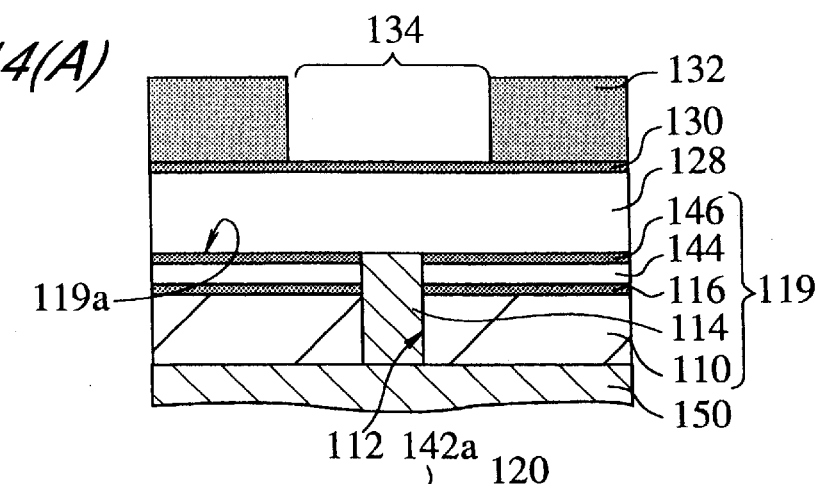
FIG. 14 (including FIG. 14(A) through FIG. 14(E)) is a process diagram to explain the method for manufacturing the fifth embodiment of the semiconductor device relating to the present invention.

A silicon dioxide film 128, silicon nitride film 130, and resist film 132, wherein a capacitor pattern 134 is formed, are formed in that order on the principal surface 119a of this preliminary underlying layer 119 (FIG. 14(A)). In other words, the capacitor pattern 134 is a first opening with a circular form, as already explained in the previous embodiments.

Figure 14B:
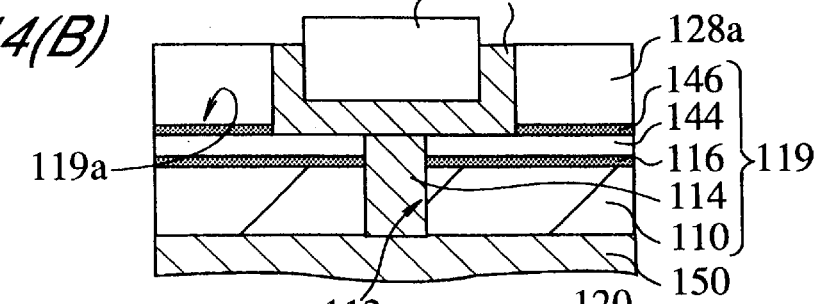

A storage electrode 120, which is the first electrode, is formed on the structure shown in FIG. 14(A) by the processes as explained with reference to FIG. 2(C) through FIG. 3(A). The structure shown in FIG. 14(B) is thereby attained. In this structure, the silicon dioxide film remains in a depression enclosed by the wall portion and floor portion of the storage electrode 120. In the figure, this remaining silicon dioxide film is labeled 142a (corresponding to FIG. 3(B)).

Figure 14C:
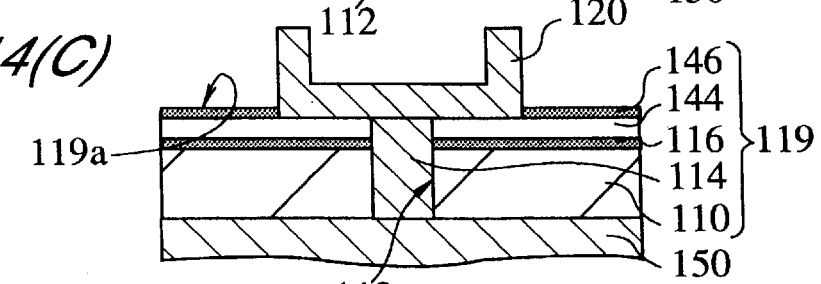
Figure 14D:
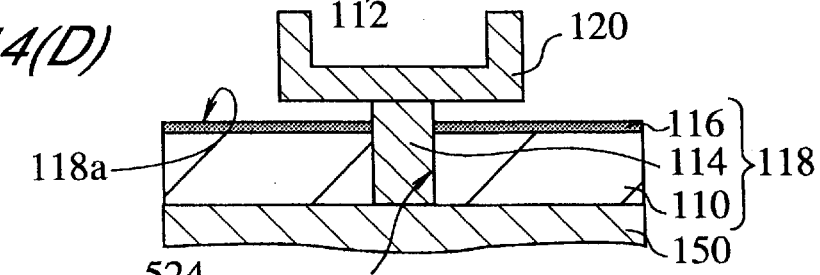
Figure 14E:
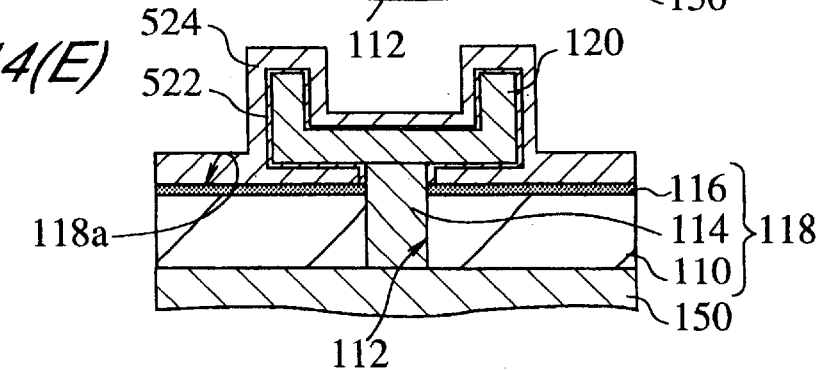

The silicon dioxide films 128a and 142a are then selectively removed by etching with hydrofluoric acid (HF), for example, with the silicon nitride film 146 acting as an etching stopper (FIG. 14(C)). As a result, part of the principal surface 119a of the preliminary underlying layer 119 is exposed. Then, the silicon nitride film 146 is removed using a phosphoric acid solution. The silicon dioxide film 144 is selectively removed using hydrofluoric acid, for example, with the silicon nitride film 116, which is the third insulating film, acting as an etching stopper (FIG. 14(D)). As a result, the lower surface of the floor portion of the storage electrode 120 and part of the surface of the plug 114 are exposed; these surfaces contribute to an increase in capacitor area. Also the remaining interlayer insulating film 110, plug 114, and silicon nitride film 116 become the new underlying layer 118.

The capacitor insulating film 522 is formed on the surface of the storage electrode 120 and the exposed surface of the plug 114. Furthermore, a polysilicon film, wherein impurities are dispersed, is formed on the surface of the capacitor insulating film 522; the second electrode, specifically the cell plate electrode 524 is thereby formed (FIG. 14(E)). In this way, a cylindrical memory cell is formed.

Consequently, in the semiconductor device of the present embodiment, the structure of the storage electrode, specifically the first electrode, is the same as that of the first electrode explained in the first embodiment. Consequently, the aperture area of the pocket 138, for forming the storage electrode, is made greater than the aperture area of the capacitor pattern 134. The aperture area of the second opening 126, delimited by the wall portion 120a of the storage electrode 120 which is formed with the polysilicon film 140, with its thickness controlled, on the pocket wall surface 138a, is thereby made greater than the aperture area of the first opening 134 (FIG. 1(B) and FIG. 13). Also, the capacitor insulating film 522 is formed between the lower surface of the floor portion 120b of the storage electrode and the principal surface 118a (FIG. 13 and FIG. 14(E)).

The same type of effects as with the first embodiment are attained with the fifth embodiment, as explained above. Furthermore, because the capacitor insulating film 522 is formed on the lower surface side of the floor portion 120b of the storage electrode 120, the capacitor area is increased by that amount and it thereby becomes possible to increase capacity.

Sixth Embodiment

Figure 15:
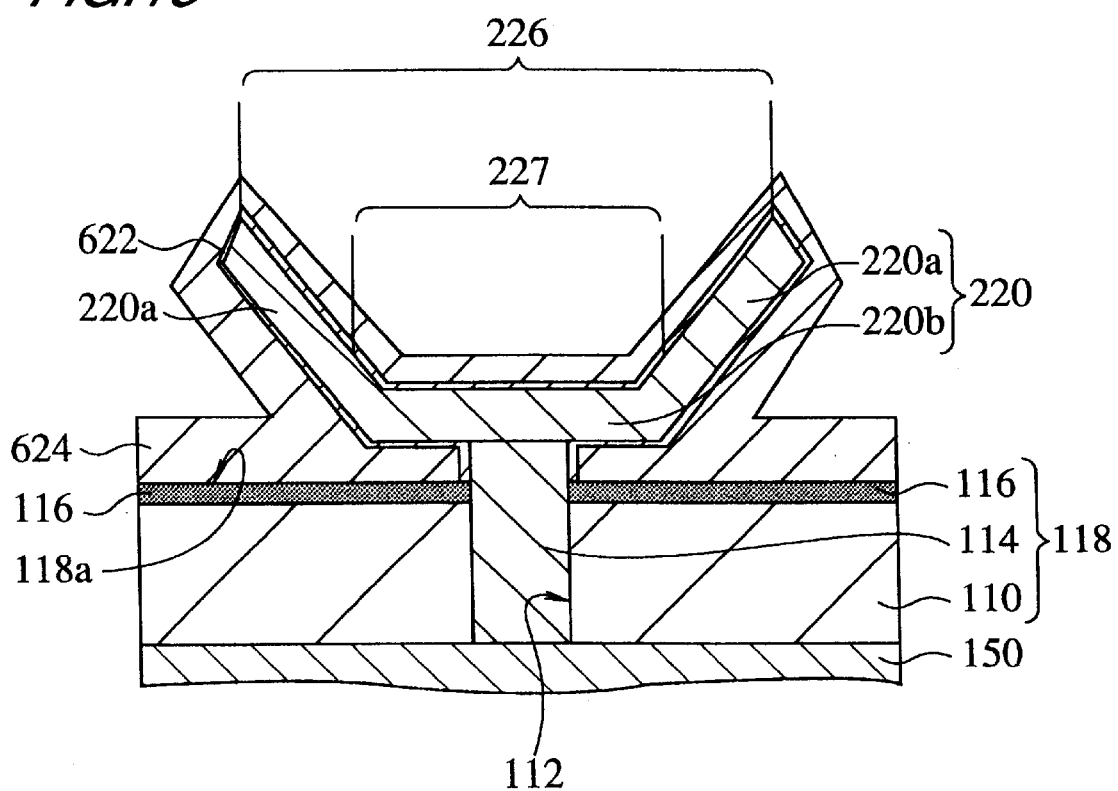
FIG. 15 is a drawing to explain the sixth embodiment of the semiconductor device relating to the present invention and is a schematic cross sectional view showing the principal elements of this semiconductor device.

The constitution of the semiconductor device in the sixth embodiment will be explained with reference to FIG. 15. FIG. 15 is a cross sectional view showing the constitution of the semiconductor device relating to the sixth embodiment. In the sixth embodiment, the explanation mainly covers the processes and constitution which are different from the second embodiment and redundant explanations are not included.

In the semiconductor device of the present embodiment, the wall portion 220a of the storage electrode 220 is at an angle to the principal surface 118a of the underlying layer 118, as shown in FIG. 15. The area of the second opening 227 delimited by this wall portion 220a becomes greater as the distance upwards from the underlying layer 118 increases. The capacitor insulating film 622 is formed between the floor portion 220b of the storage electrode 220 and the principal surface 118a of the underlying layer 118. Therefore, the floor portion 220b of the storage electrode 220 and principal surface 118a of the underlying layer 118 are separated vertically by a desired distance.

The method for manufacturing the semiconductor device of this embodiment will be explained with reference to FIG. 16. FIG. 16 is a cross sectional view showing the manufacturing process for the sixth embodiment.

Figure 16A:
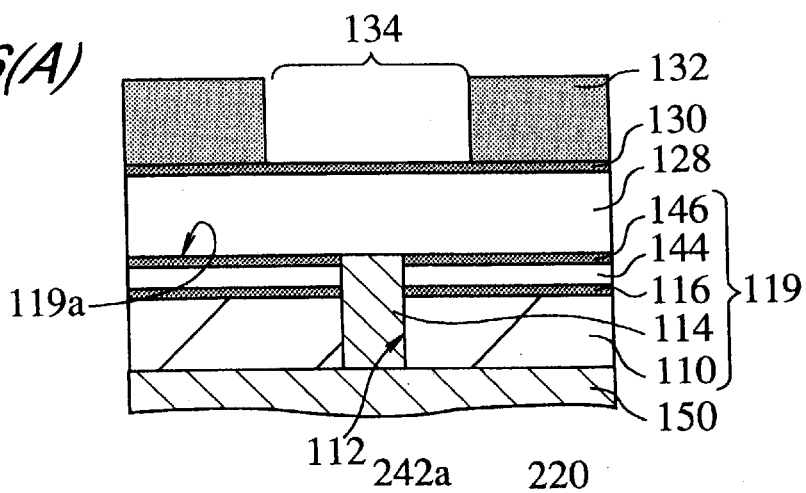
FIG. 16 (including FIG. 16(A) through FIG. 16(E)) is a process diagram to explain the method for manufacturing the sixth embodiment of the semiconductor device relating to the present invention.

A preliminary underlying layer 119 is formed. The process may be the same as that in the fifth embodiment, so an explanation is omitted. Next, a silicon dioxide film 128 as the first insulating film, silicon nitride film 130 as the second insulating film, and resist film 132, wherein a capacitor pattern 134 is formed, are formed in that order on the principal surface 119a of this preliminary underlying layer 119; the structure shown in FIG. 16(A) is thereby attained. The capacitor pattern 134 is a first opening with a circular form.

Figure 16B:
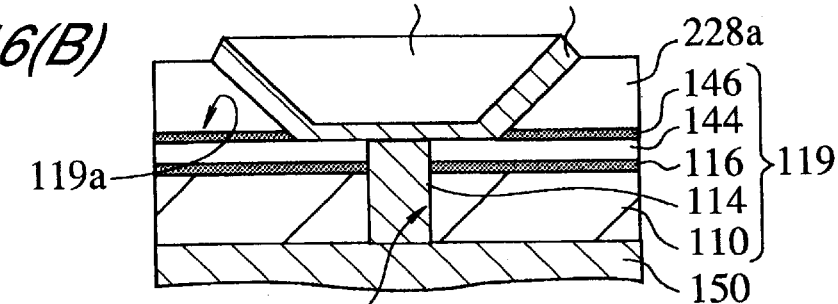

A storage electrode 220, which is the first electrode, is formed on the structure shown in FIG. 16(A) by the processes as explained with reference to FIG. 5(C) through FIG. 6(A). The structure shown in FIG. 16(B) is thereby attained. In this structure, the silicon dioxide film remains in a depression enclosed by the wall portion and floor portion of the storage electrode 220. In the figure, this remaining silicon dioxide film is labeled 242a.

Figure 16C:
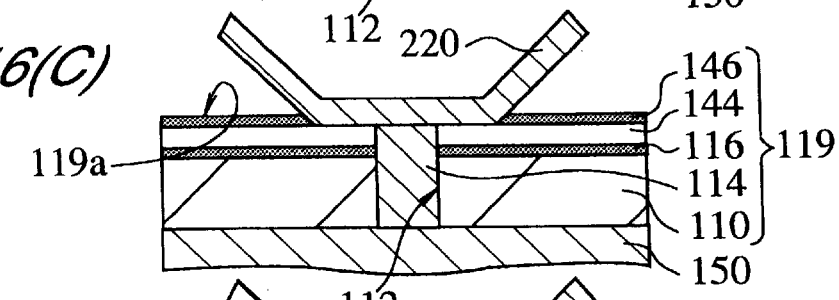
Figure 16D:
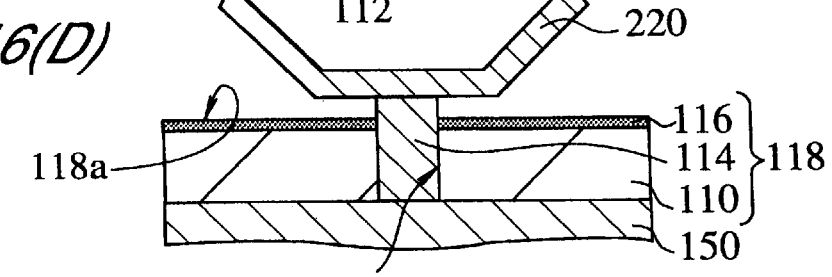
Figure 16E:
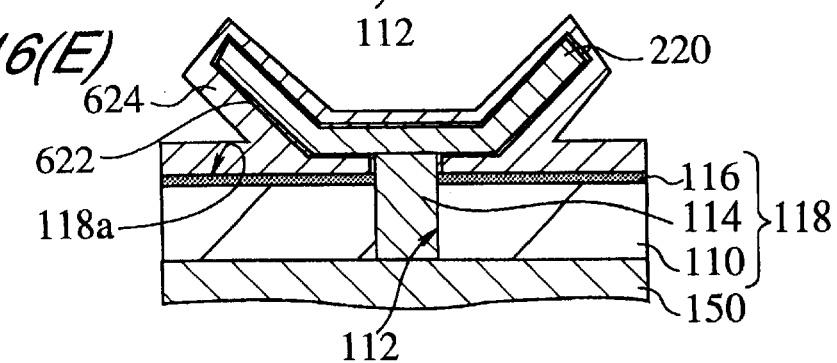

The silicon dioxide films 228a and 242a are then selectively removed by etching with hydrofluoric acid (HF), for example, with the silicon nitride film 146 acting as an etching stopper (FIG. 16(C)). As a result, part of the principal surface 119a of the preliminary underlying layer 119 is exposed. Then, the silicon nitride film 146 is removed using a phosphoric acid solution. The silicon dioxide film 144 is selectively removed using hydrofluoric acid, for example, with the silicon nitride film 116, which is the intermediate insulating layer, acting as an etching stopper (FIG. 16(D)). As a result, the lower surface of the floor portion of the storage electrode 220 and part of the surface of the plug 114 are exposed; these surfaces contribute to an increase in capacitor area. Also the remaining interlayer insulating film 110, plug 114, and silicon nitride film 116 become the new underlying layer 118.

The capacitor insulating film 622 is formed on the surface of the storage electrode 220 and the exposed surface of the plug 114. Furthermore, a polysilicon film, wherein impurities are dispersed, is formed on the surface of the capacitor insulating film 622; the cell plate electrode 624 is thereby formed (FIG. 16(E)). In this way, a cylindrical memory cell is formed.

Consequently, in the semiconductor device of the sixth embodiment, the aperture area of the pocket 238 is made greater than the aperture area of the capacitor pattern 134. A polysilicon film 240, with the thickness thereof controlled, is formed on the pocket wall surface 238a. The polysilicon film 240 is patterned and the storage electrode 220 is formed. The aperture area of the third opening 226, delimited by the upper edge of the wall portion 220a of the storage electrode 220, or the aperture area of the second opening 227 formed at an intermediate position of the wall portion 220a, is made greater than the aperture area of the first opening 134 (FIG. 15). Also, the capacitor insulating film 622 is formed between the lower surface of the floor portion 220b of the storage electrode 220 and the principal surface 118a (FIG. 15). In this case, the second and third openings are the same at the upper edge of the wall portion 220a.

Consequently, in the semiconductor device of the sixth embodiment, the structure of the storage electrode, or rather the first electrode, is the same as the first electrode explained in the second embodiment. Consequently, the aperture area of the pocket 238 for forming the storage electrode is made greater than the aperture area of the capacitor pattern 134. The aperture area of the second opening 227, delimited by the wall portion 220a of the storage electrode 220 formed of the polysilicon film 240, with its thickness controlled, on the pocket wall surface 238a, or the aperture area of the third opening 226, is thereby made greater than the aperture area of the first opening 134 (FIG. 4(B) and FIG. 15). Also, the capacitor insulating film 622 is formed between the lower surface of the floor portion 220b of the storage electrode 220 and the principal surface 118a (FIG. 15 and FIG. 16(E)).

The same type of effects as with the second embodiment are attained with the sixth embodiment, as explained above. Furthermore, because the capacitor insulating film is formed on the lower surface side of the floor portion of the storage electrode, the capacitor area is increased by that amount and it thereby becomes possible to increase capacity.

Seventh Embodiment

The constitution of the semiconductor device in the seventh embodiment will be explained with reference to FIG. 17. FIG. 17 is a cross sectional view showing the constitution of the semiconductor device relating to the seventh embodiment. In the seventh embodiment, the explanation mainly covers the processes and constitution which are different from the third embodiment and redundant explanations are not included.

In the semiconductor device of the seventh embodiment, the wall portion 320a of the storage electrode 320 comprises a lower portion $320a_1$ and an upper portion $320a_2$, as shown in FIG. 17. The lower portion $320a_1$ is put at an angle to the principal surface 118a of the underlying layer 118. This lower portion $320a_1$ is formed in the shape of an umbrella and widens at the end, so that the area of the second opening 327 formed thereby becomes greater as the distance upwards from the underlying layer 118 increases. In this example, this lower portion is called the angled portion. The upper portion $320a_2$, connected to the upper end of this lower portion $320a_1$, is established perpendicular to the principal surface 118a so as to form a normal cylinder. In this example, the upper portion is called the perpendicular portion. The capacitor insulating film 722 is formed between the floor portion 320b of the storage electrode 320 and the principal surface 118a of the underlying layer 118. Therefore, the floor portion 320b of the storage electrode 320 and principal surface 118a of the underlying layer 118 are separated vertically by a desired distance.

The method for manufacturing the semiconductor device of the present embodiment will be explained with reference to FIG. 18. FIG. 18 is a cross sectional view showing the method for manufacturing the seventh embodiment.

A preliminary underlying layer 119 is formed. The process may be the same as that in the fifth embodiment, so an explanation is omitted. Next, a silicon dioxide film 128 as the first insulating film, silicon nitride film 130 as the second insulating film, and resist film 132, wherein a capacitor pattern 134 is formed, are formed in that order on the principal surface 119a of this preliminary underlying layer 119 (FIG. 18(A)). The capacitor pattern 134 is a first opening with a circular form.

A storage electrode 320, which is the first electrode, is formed by the processes as explained with reference to FIG. 8(C) through FIG. 9(A). The structure shown in FIG. 18(B) is thereby attained. In this structure, the silicon dioxide film remains in a depression enclosed by the wall portion and floor portion of the storage electrode 320. In the figure, this remaining silicon dioxide film is labeled 342a (corresponds to FIG. 9(B)).

The silicon dioxide films 328a and 342a are then selectively removed by etching with hydrofluoric acid, for example, with the silicon nitride film 146 acting as an etching stopper (FIG. 18(C)). As a result, part of the principal surface 119a of the preliminary underlying layer 119 is exposed. Then, the silicon nitride film 146 is removed using a phosphoric acid solution. The silicon dioxide film 144 is selectively removed using hydrofluoric acid, for example, with the silicon nitride film 116, which is the intermediate insulating layer, acting as an etching stopper (FIG. 18(D)). As a result, the lower surface of the floor portion of the storage electrode 320 and part of the surface of the plug 114 are exposed; these surfaces contribute to an increase in capacitor area. Also the remaining interlayer insulating film 110, plug 114, and silicon nitride film 116 become the new underlying layer 118.

The capacitor insulating film 722 is formed on the surface of the storage electrode 320 and the exposed surface of the plug 114. Furthermore, a polysilicon film, wherein impurities are dispersed, is formed on the surface of the capacitor insulating film 722; the cell plate electrode 724 is thereby formed (FIG. 18(E)). In this way, a cylindrical memory cell is formed.

Consequently, in the semiconductor device of the seventh embodiment, the structure of the storage electrode 320, specifically the first electrode, is the same as that of the first electrode explained in the third embodiment. Consequently, the aperture area of the pocket 338, for forming the storage electrode, is made greater than the aperture area of the capacitor pattern 134 (see FIG. 8(A)–8(D)). The aperture area of the second opening 327, delimited by the wall portion 320a of the storage electrode 320, which is formed with the polysilicon film 340 with its thickness controlled, on the pocket wall surface 338a and floor surface 338b, or the aperture area of the third opening 326, is thereby made greater than the aperture area of the first opening 134 (FIG. 7(B) and FIG. 17). Also, the capacitor insulating film 722 is formed between the lower surface of the floor portion 320b of the storage electrode 320 and the principal surface 118a (FIG. 17 and FIG. 18(E)).

The same type of effects as with the sixth embodiment are attained with the seventh embodiment. Additionally, the angling of the wall portion 320a can increase capacitor area, as well as further reduce the step between the memory cell portion and the surrounding area. Because the length of the angled portion of the wall portion 320a is less than that in the constitution of the sixth embodiment, the risk of the storage electrode 320 separating is eliminated.

Eighth Embodiment

Figure 19:
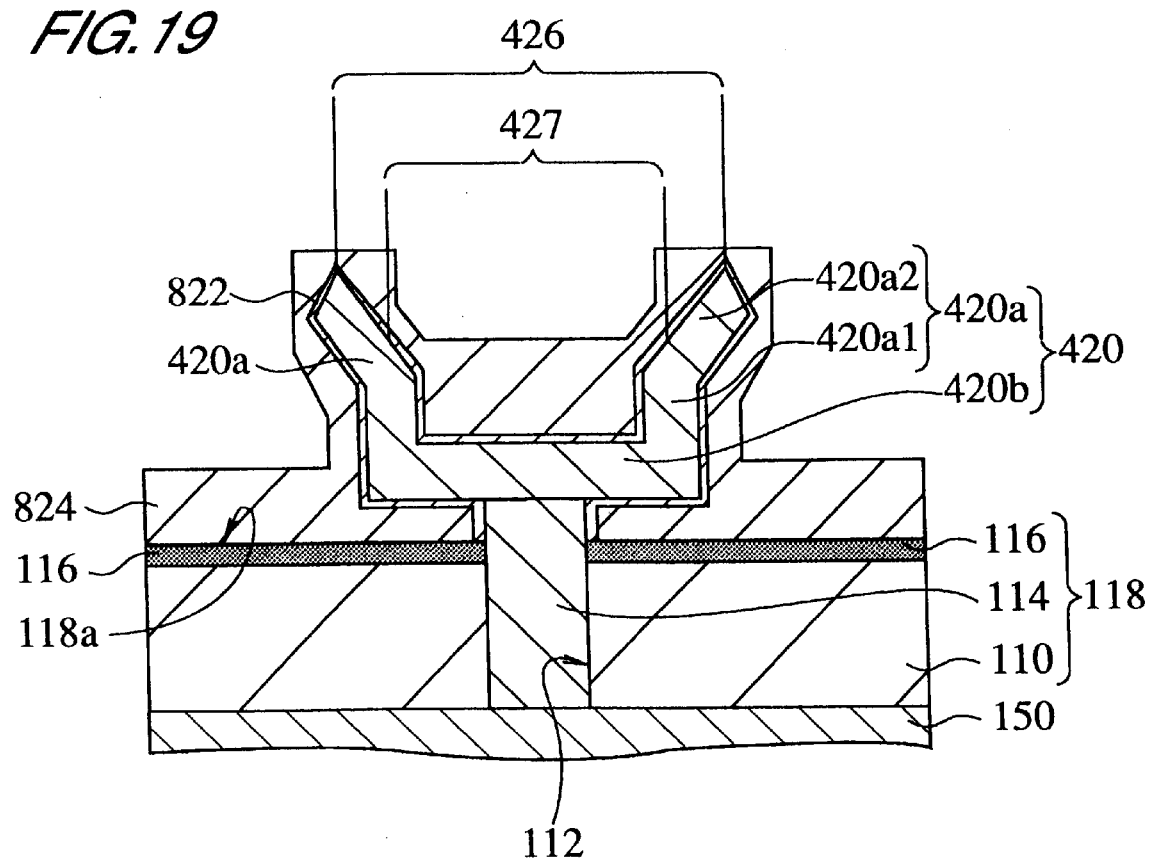
FIG. 19 is a drawing to explain the eighth embodiment of the semiconductor device relating to the present invention and is a schematic cross sectional view showing the principal elements of this semiconductor device.

The constitution of the semiconductor device in the eighth embodiment will be explained with reference to FIG. 19. FIG. 19 is a cross sectional view showing the constitution of the semiconductor device relating to the eighth embodiment. In the eighth embodiment, the explanation mainly covers the processes and constitution which are different from the fourth embodiment and redundant explanations are not included.

In the semiconductor device of the eighth embodiment, the wall portion 420a of the storage electrode 420 comprises a lower portion 420a$_1$ and an upper portion 420a$_2$, as shown in FIG. 19. The upper portion is formed in the shape of an umbrella and widens at the end, so that the area of the second opening 227 formed thereby becomes greater as the distance upwards from the underlying layer 118 increases. The lower portion 420a$_1$, connected to the lower end of this upper portion, is established perpendicular to the principal surface 118a so as to form a normal cylinder. In this example, the upper portion is called the angled portion and the lower portion is called the perpendicular portion. The capacitor insulating film 822 is formed between the floor portion 420b of the storage electrode 420 and the principal surface 118a of the underlying layer 118. Therefore, the floor portion 420b of the storage electrode 420 and principal surface 118a of the underlying layer 118 are separated vertically by a desired distance.

The method for manufacturing the semiconductor device of the present embodiment will be explained with reference to FIG. 20. FIG. 20 is a cross sectional view showing the method for manufacturing the eighth embodiment.

Figure 20A:
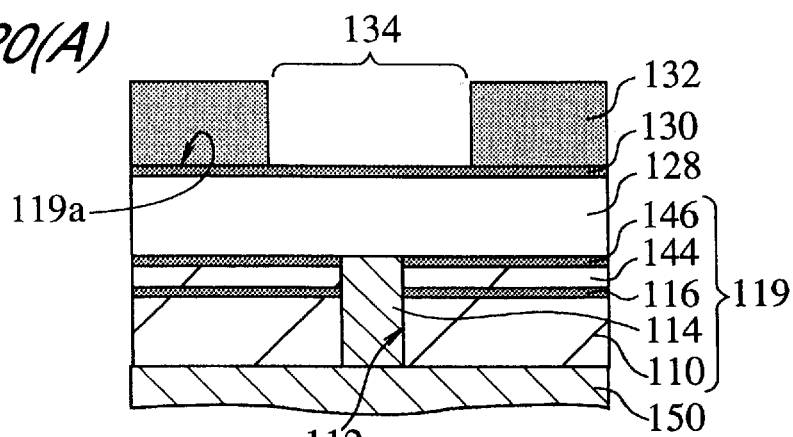
FIG. 20 (including FIG. 20(A) through FIG. 20(E)) is a process diagram to explain the method for manufacturing the eighth embodiment of the semiconductor device relating to the present invention.
Figure 20B:
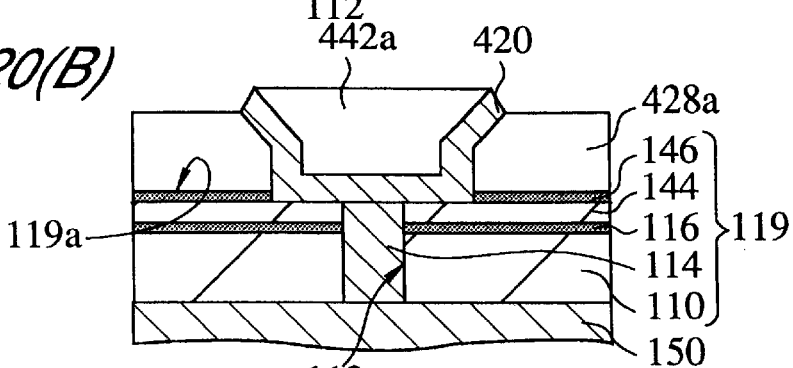

A preliminary underlying layer 119 is formed. The process may be the same as that in the fifth embodiment, so an explanation is omitted. Next, a silicon dioxide film 128 as the first insulating film, silicon nitride film 130 as the second insulating film, and resist film 132, wherein a capacitor pattern 134 is formed, are formed in that order on the principal surface 119a of this preliminary underlying layer 119; the structure as shown in FIG. 20(A) is attained. The capacitor pattern 134 is a first opening with a circular form.

A storage electrode 420, which is the first electrode, is formed on the structure shown in FIG. 20(A) by the processes as explained with reference to FIG. 11(C) through FIG. 12(A). The silicon dioxide film remains in a depression enclosed by the wall portion and floor portion of the storage electrode 420; this is labeled 442a.

Figure 20C:
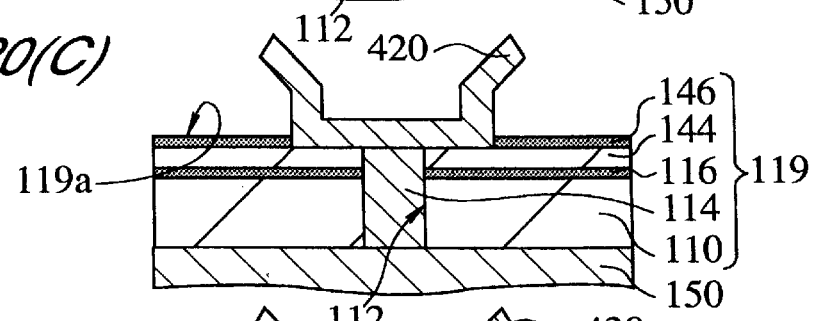
Figure 20D:
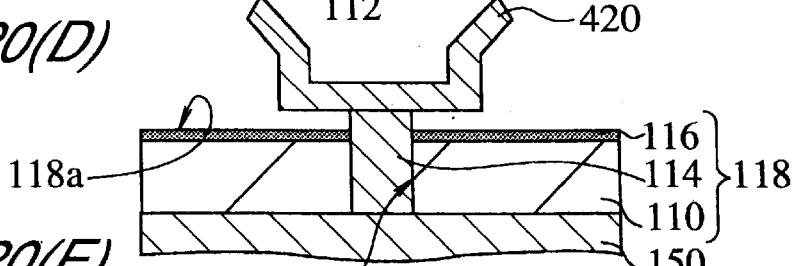
Figure 20E:
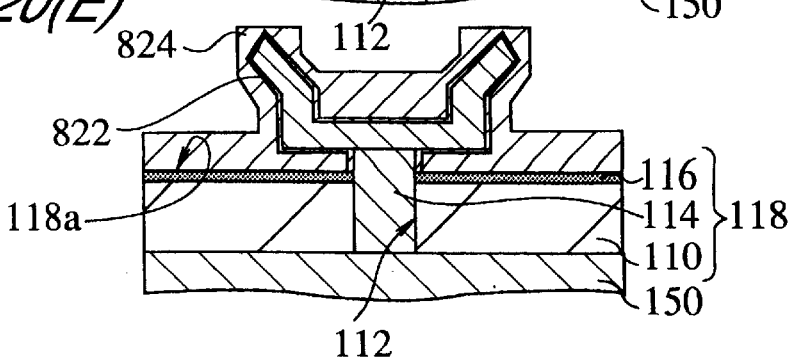
Figure 21A:
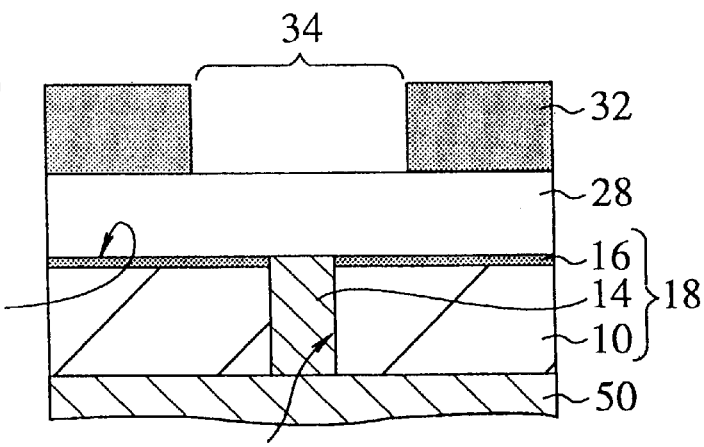
FIG. 21 (including FIG. 21(A) through FIG. 21(D)) is a process diagram to explain the method for manufacturing a conventional semiconductor device.
Figure 21B:
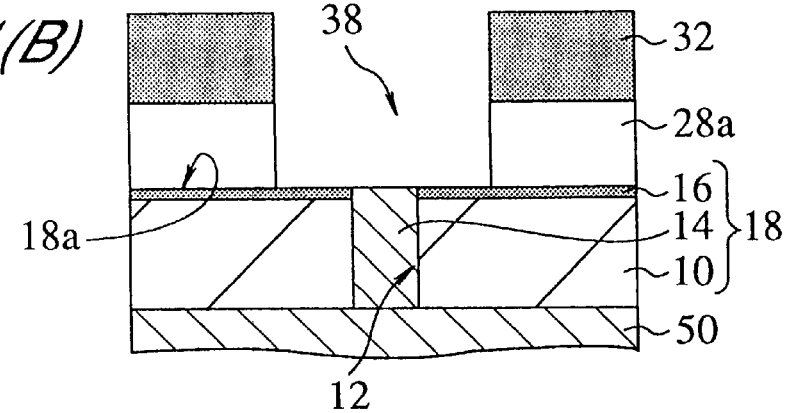
Figure 21C:
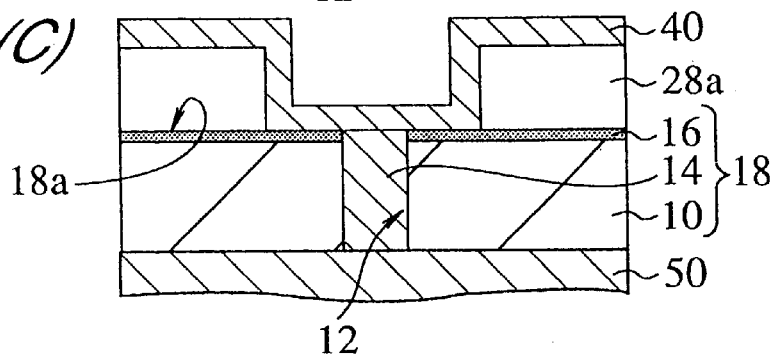
Figure 21D:
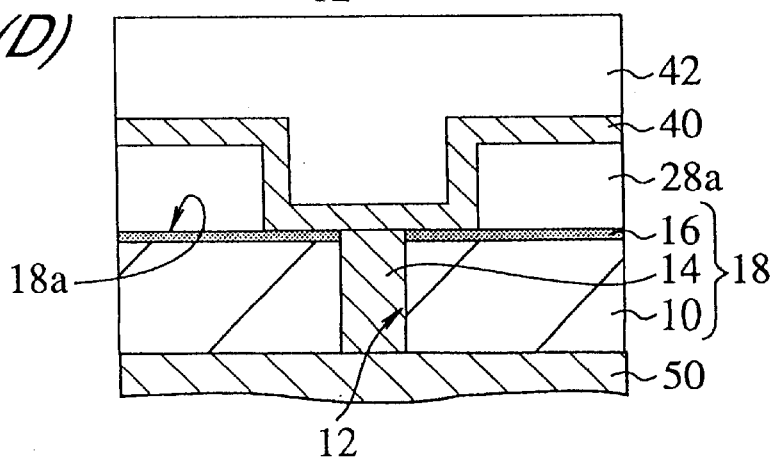
Figure 22A:
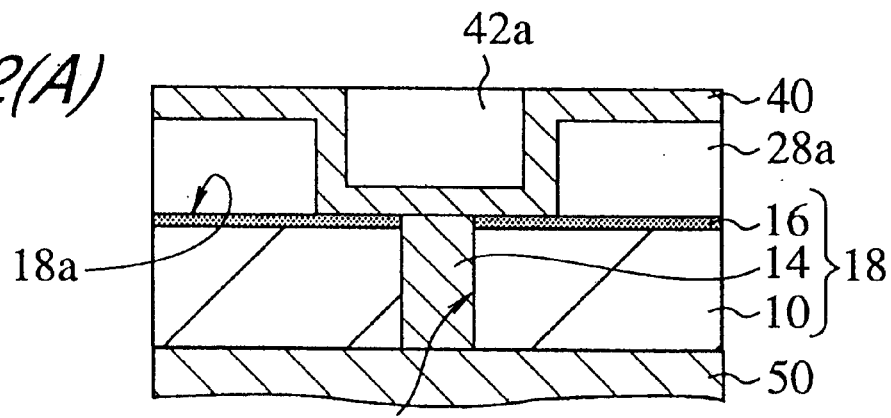
FIG. 22 (including FIG. 21(A) through FIG. 21(C)) is a conventional process diagram which is a continuation of FIG. 21.
Figure 22B:
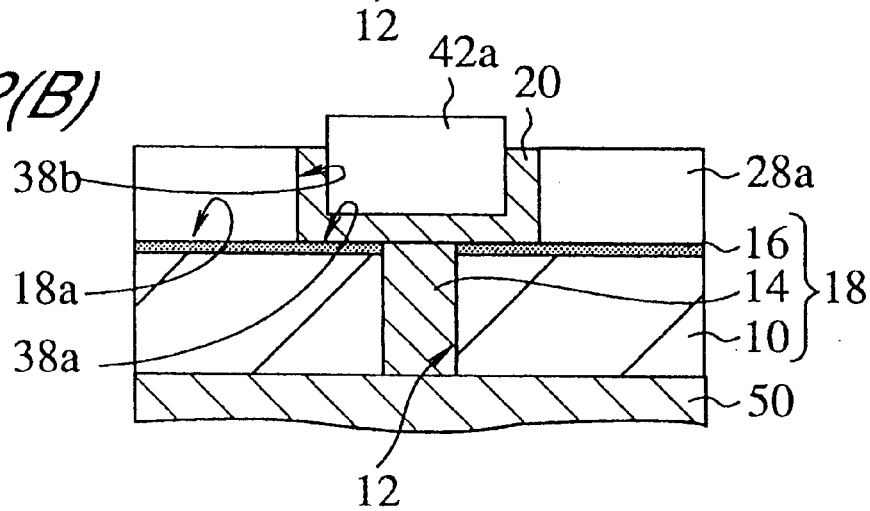
Figure 22C:
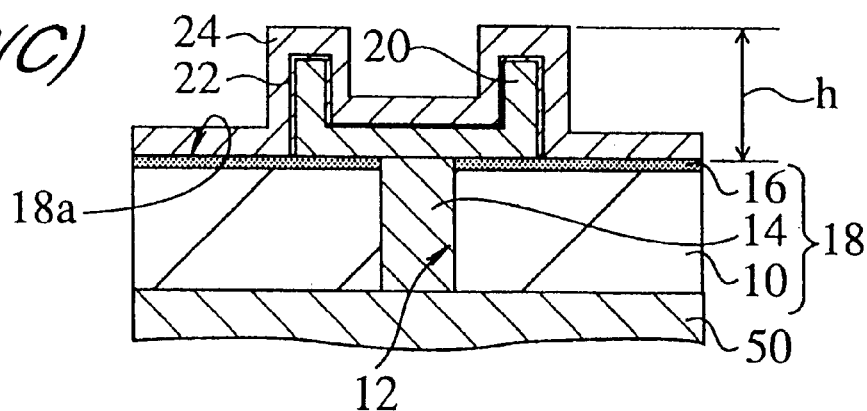

The silicon dioxide films 428a and 442a are then selectively removed by etching with hydrofluoric acid, for example, with the silicon nitride film 146 acting as an etching stopper (FIG. 20(C)). As a result, part of the principal surface 119a of the preliminary underlying layer 119 is exposed. The silicon nitride film 146 is then removed using a phosphoric acid solution. The silicon dioxide film 144 is selectively removed using hydrofluoric acid, for example, with the silicon nitride film 116, which is the intermediate insulating layer, acting as an etching stopper (FIG. 20(D)). As a result, the lower surface of the floor portion of the storage electrode 420 and part of the surface of the plug 114 are exposed; these surfaces contribute to an increase in capacitor area. Also the remaining interlayer insulating film 110, plug 114, and silicon nitride film 116 become the new underlying layer 118.

The capacitor insulating film 822 is formed on the surface of the storage electrode 420 and the exposed surface of the plug 114. Furthermore, a polysilicon film, wherein impurities are dispersed, is formed on the surface of the capacitor insulating film 822; the cell plate electrode 824 is thereby formed (FIG. 20(E)). In this way, a cylindrical memory cell is formed.

Consequently, in the semiconductor device of the eighth embodiment, the structure of the storage electrode 420, specifically the first electrode, is the same as that of the first electrode explained in the fourth embodiment. Consequently, the aperture area of the pocket 438, for forming the storage electrode, is made greater than the aperture area of the capacitor pattern 134 (See FIG. 11(C)). The aperture area of the second opening 427, delimited by the wall portion 420a of the storage electrode 420 which is formed with the polysilicon film, with its thickness controlled, in the pocket 438, or the aperture area of the third opening 426, is thereby made greater than the aperture area of the first opening 134 (FIG. 7(B) and FIG. 19). Also, the capacitor insulating film 822 is formed between the lower surface of the floor portion 420b of the storage electrode 420 and the principal surface 118a (FIG. 19 and FIG. 20(E)).

The same type of effects as with the sixth embodiment can be attained with the eighth embodiment. Additionally, the angling of the upper portion of the wall portion 420a can increase capacitor area, as well as further reduce the step between the memory cell portion and the surrounding area. Because the length of the angled portion 420a$_2$ of the wall portion 420a is shorter than that in the constitution of the sixth embodiment, the risk of the storage electrode 420 separating is eliminated.

Furthermore, in the seventh embodiment, endpoint detection during the anisotropic etching to form the pocket 338 may become difficult and irregular. In the eighth embodiment, however, the silicon nitride film 116 can be used as the film for endpoint detection, as discussed above (in the explanation for the fourth embodiment). Consequently, etching becomes easy and reproducible.

What is claimed is:

1. A method for manufacturing a semiconductor device, comprising:

forming a first insulating film, a second insulating film, and a resist film, in order, on a principal surface of an underlying layer;

forming a first opening, as a capacitor pattern, in said resist film using photolithography;

forming an initial pocket in said first insulating film by anisotropic etching of said second and first insulating films, in order, until the principal surface of said underlying layer is exposed, said resist film with the capacitor pattern being used as a mask;

forming a pocket, wider than said initial pocket, in said first insulating film by isotropic etching of inner walls of said initial pocket using the remaining second insulating film as a mask;

forming a conductive film on a wall surface and a floor surface of said pocket;

patterning said conductive film and forming a first electrode; and forming a dielectric layer and a second electrode, in order, on said first electrode, the method further comprising forming a third insulating film, before said first insulating film, as an interlayer insulating film and in said underlying layer; and removing by etching a principal surface side of said underlying layer, until said interlayer insulating film is exposed, said removing by etching occurring between said forming a first electrode and said forming a dielectric layer.

2. A method for manufacturing a semiconductive device, comprising:

forming a first insulating film, a second insulating film, and a resist film, in order, on a principal surface of an underlying layer;

forming a first opening, as a capacitor pattern, in said resist film using photolithography;

forming an initial pocket in said second insulating film by anisotropic etching of said second insulating film, until an upper surface of said first insulating film is exposed, said resist film with the capacitor pattern being used as a mask;

forming a pocket, wider than said initial pocket, in said first insulating film by isotropic etching of inner walls of said first insulating film using the remaining second insulating film as a mask, until the principal surface of said underlying layer is exposed;

forming a conductive film on a wall surface and a floor surface of said pocket;

patterning said conductive film and forming a first electrode; and forming a dielectric layer and a second electrode, in order, on said first electrode, the method further comprising forming a third insulating film, before said first insulating film, as an interlayer insulating film and in said underlying layer; and removing by etching a principal surface side of said underlying layer, until said interlayer insulating film is exposed, said removing by etching occurring between said forming a first electrode and said forming a dielectric layer.

3. A method for manufacturing a semiconductor device, comprising:

forming a first insulating film, a second insulating film, and a resist film, in order, on a principal surface of an underlying layer;

forming a first opening, as a capacitor pattern, in said resist film using photolithography;

forming an initial pocket in said first insulating film by anisotropic etching of said second and first insulating films, in order, until partway through said first insulating film, said resist film with the capacitor pattern being used as a mask;

forming a pocket, wider than said initial pocket, in said first insulating film by isotropic etching of inner walls of said initial pocket using the remaining second insulating film as a mask, until the principal surface of said underlying layer is exposed;

forming a conductive film on a wall surface and a floor surface of said pocket;

patterning said conductive film and forming a first electrode; and forming a dielectric layer and a second electrode, in order, on said first electrode, the method further comprising forming a third insulating film, before said first insulating film, as an interlayer insulating film and in said underlying layer; and removing by etching a principal surface side of said underlying layer, until said interlayer insulating film is exposed, said removing by etching occurring between said forming a first electrode and said forming a dielectric layer.

4. A method for manufacturing a semiconductor device, comprising:

forming a first insulating film, a second insulating film, and a resist film, in order, on a principal surface of an underlying layer;

forming a first opening, as a capacitor pattern, in said resist film using photolithography;

forming a standard initial pocket in said second insulating film by anisotropic etching of said second insulating film, said resist film with the capacitor pattern being used as a mask;

forming an initial pocket in said first insulating film by isotropic etching of said first insulating film using the remaining second insulating film as a mask, until partway through said first insulating film;

forming a pocket, wider than said initial pocket, in said first insulating film by anisotropic etching of inner walls of said initial pocket using the remaining second insulating film as a mask, until the principal surface of said underlying layer is exposed;

forming a conductive film on a wall surface and a floor surface of said pocket;

patterning said conductive film and forming a first electrode; and forming a dielectric layer and a second electrode, in order, on said first electrode, the method further comprising:

forming a third insulating film, before said first insulating film, as an interlayer insulating film and in said underlying layer; and removing by etching a principal surface side of said underlying layer, until said interlayer insulating film is exposed, said removing by etching occurring between said forming a first electrode and said forming a dielectric layer.

* * * * *